(12) United States Patent
Sakaguchi et al.

(10) Patent No.: US 6,380,099 B2
(45) Date of Patent: *Apr. 30, 2002

(54) POROUS REGION REMOVING METHOD AND SEMICONDUCTOR SUBSTRATE MANUFACTURING METHOD

(75) Inventors: Kiyofumi Sakaguchi; Kazutaka Yanagita, both of Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/211,738

(22) Filed: Dec. 15, 1998

(30) Foreign Application Priority Data

Jan. 14, 1998 (JP) .............................. 10-005812

(51) Int. Cl.[7] .............................. H01L 21/00
(52) U.S. Cl. .............. 438/747; 156/345; 216/33; 216/56; 216/99; 438/753; 438/756
(58) Field of Search ................. 438/691, 692, 438/747, 753, 756; 216/18, 19, 33, 38, 39, 52, 56, 88, 90, 99; 156/345 L, 345 LP

(56) References Cited

U.S. PATENT DOCUMENTS

| | | | |
|---|---|---|---|
| 5,277,748 A | | 1/1994 | Sakaguchi et al. |
| 5,277,769 A | | 1/1994 | Medernach |
| 5,670,411 A | * | 9/1997 | Yonehara et al. ....... 438/753 X |
| 5,695,557 A | | 12/1997 | Yamagata et al. |
| 5,767,020 A | | 6/1998 | Sakaguchi et al. |

FOREIGN PATENT DOCUMENTS

| | | |
|---|---|---|
| EP | 0 663 688 A2 | 7/1995 |
| EP | 0 753 886 A1 | 7/1996 |
| EP | 0 810 643 A2 | 5/1997 |
| EP | 0 860 860 A2 | 8/1998 |
| JP | 48-031108 | 8/1971 |
| JP | 05-090242 | 4/1983 |
| JP | 63-182820 | 7/1988 |
| JP | 01-050532 | 2/1989 |
| JP | 01-212426 | 8/1989 |
| JP | 05-275663 | 10/1993 |
| JP | 11-204494 | 7/1999 |

OTHER PUBLICATIONS

Sakaguchi et al., Current Progress In Epitaxial Layer Transfer (ELTRAN), IEICE Transactions on Electronics, vol. E80–C, No. 3, Mar. 1, 1997, pp. 378–387.
Sato et al., High–Quality Epitaxial Layer Transfer (ELTRAN) By Bond and Etch–back of Porous SI, 1995 IEEE International SOI Conference Proceedings, Oct. 3, 1995, p. 176–177.
Singapore Search Report for the corresponding Singapore Application 9805832–4 (Dated Sep. 13, 2000).
A communication from Japanese Patent Office dated Feb. 23, 2001.

* cited by examiner

*Primary Examiner*—William Powell
(74) *Attorney, Agent, or Firm*—Morgan & Finnegan, L.L.P.

(57) ABSTRACT

A given planarity of the underlying layer is ensured after removal of a porous layer. In the first step, a porous layer is filled with a preprocess solution (e.g., water). In the second step, the preprocess solution filling the porous layer is replaced with an etchant (e.g., fluoric acid), and the porous layer is etched by the etchant. With this process, the time in which the porous layer is filled with the etchant is shortened to suppress variations in progress of etching.

33 Claims, 14 Drawing Sheets

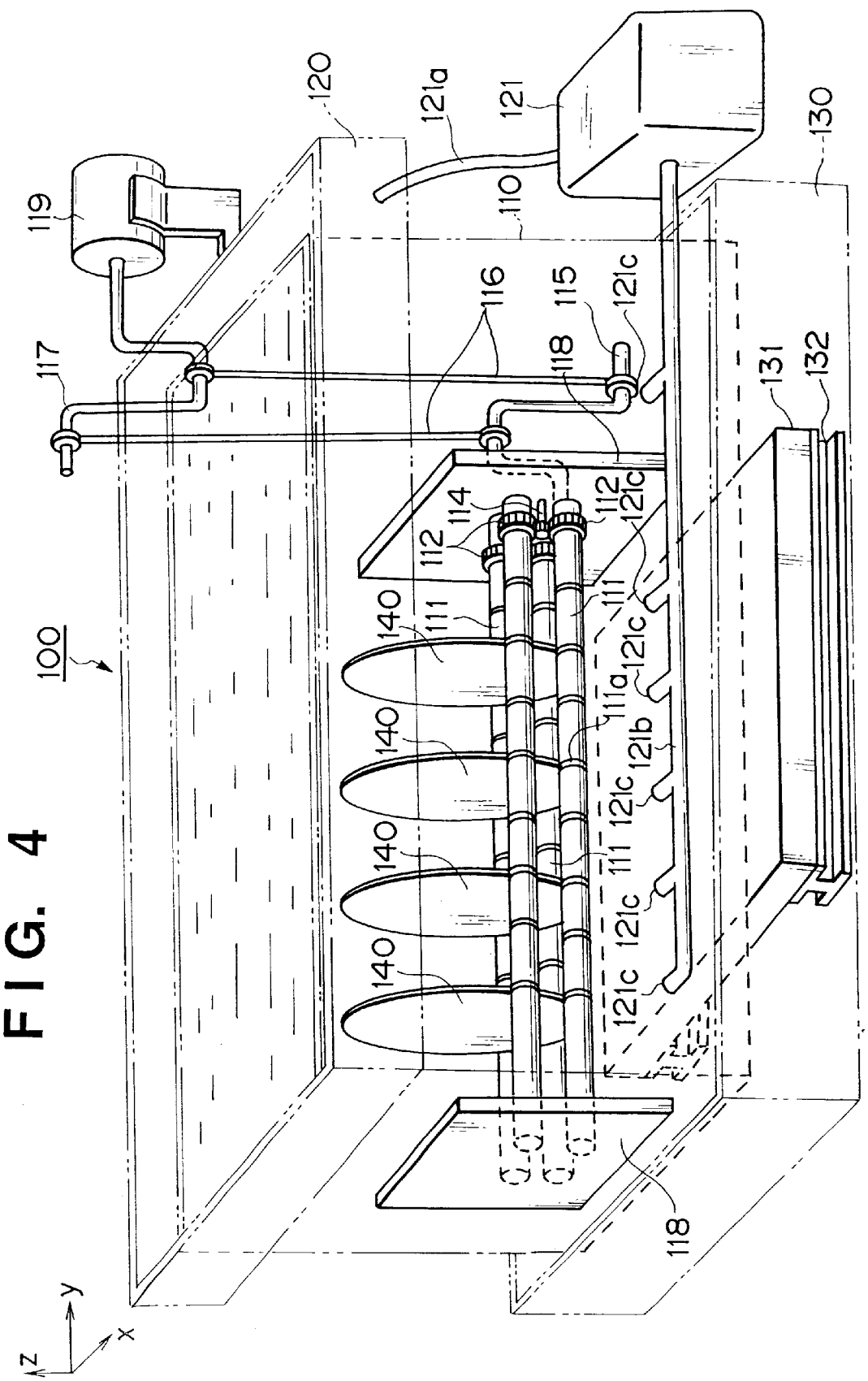

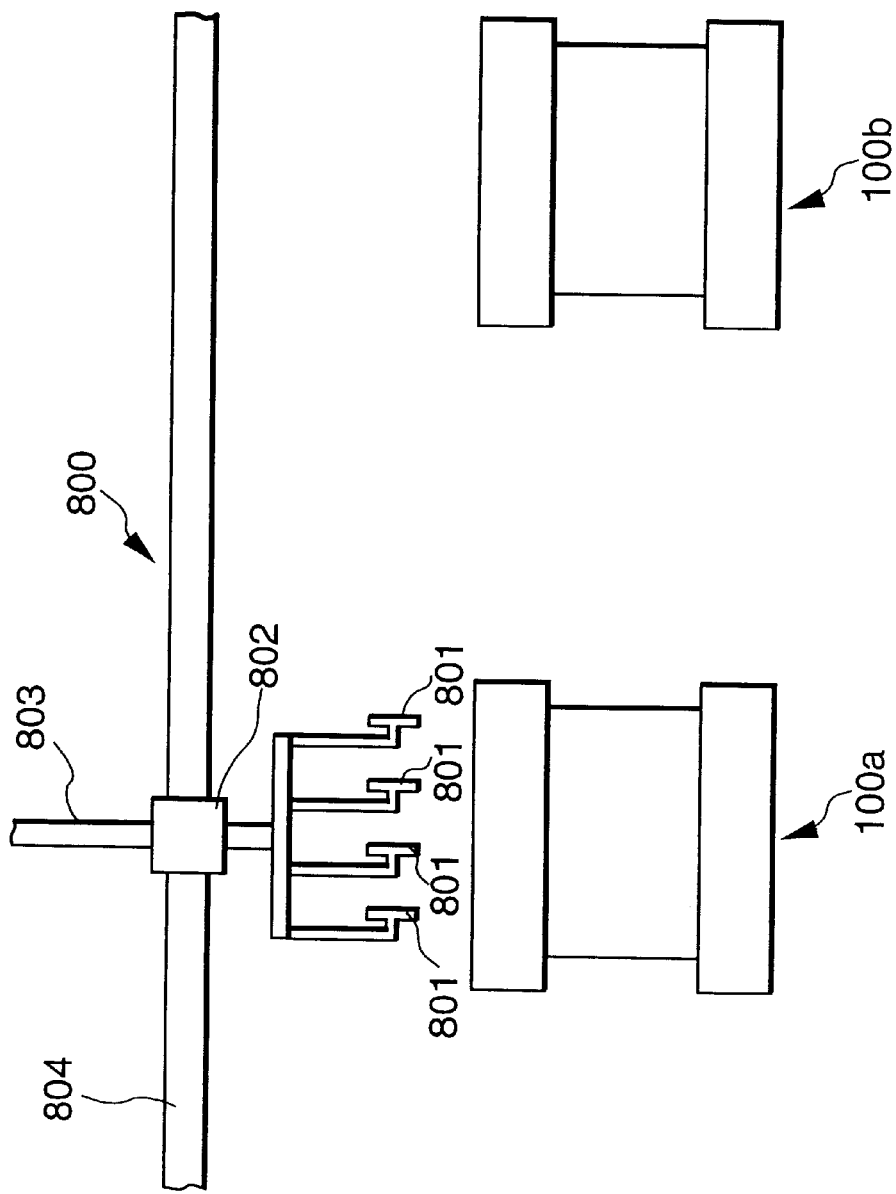

POROUS REGION REMOVING METHOD AND SEMICONDUCTOR SUBSTRATE MANUFACTURING METHOD

BACKGROUND OF THE INVENTION

1. Field of the Invention

The present invention relates to a porous region removing method and a semiconductor substrate manufacturing method and, more particularly, to a method of removing a porous region from a substrate having the porous region, a semiconductor substrate manufacturing method using this method, and an apparatus for removing a porous region.

2. Description of the Related Art

There is a method of sequentially forming a porous Si layer and a single-crystal Si layer on a first substrate, bonding the first substrate to a separately prepared second substrate, and separating the bonded substrate stack into two substrates at the porous Si layer to transfer the single-crystal Si layer formed on the first substrate side to the second substrate side, thereby manufacturing an SOI substrate.

In this method, after the bonded substrate stack is separated into two substrates, the porous Si layer remaining on the surface on the second substrate side is removed. In removing the porous Si layer, the planarity of the surface of the underlying second substrate and, more particularly, the film thickness uniformity of the single-crystal Si layer as the surface layer of the second substrate is preferably not hindered.

SUMMARY OF THE INVENTION

The present invention has been made in consideration of the above situation, and has as its object to provide a porous region removing method capable of maintaining a given planarity of an underlying layer and a semiconductor substrate manufacturing method using this method.

According to the present invention, there is provided a porous region removing method for removing a porous region from a substrate having the porous region, characterized by comprising the first step of filling the porous region with a first process solution having no etching function or weak etching function for a porous material, and the second step of etching the porous region using a second process solution having an etching function for a porous material after the first step.

In the porous region removing method, the second step preferably comprises replacing the first process solution filling the porous region with the second process solution to etch the porous region.

In the porous region removing method, the substrate to be processed preferably essentially consists of single-crystal Si.

In the porous region removing method, the porous region preferably essentially consists of an Si material.

In the porous region removing method, the porous region is preferably formed by anodizing a substrate consisting of single-crystal Si.

In the porous region removing method, preferably, the first process solution chemically changes pore walls in the porous region, and the second process solution has the etching function not only for a porous material but also for a substance which chemically changes.

In the porous region removing method, the first process solution preferably has an oxidation function for the pore walls in the porous region.

In the porous region removing method, the first process solution is preferably water.

In the porous region removing method, the first process solution preferably contains a material selected from the group consisting of an alcohol, hydrogen peroxide, nitric acid, and hydrochloric acid.

In the porous region removing method, the second process solution preferably contains hydrofluoric acid.

In the porous region removing method, the second process solution is preferably a material selected from the group consisting of (a) a mixed solution prepared by adding at least one of an alcohol and hydrogen peroxide to hydrofluoric acid, (b) a mixed solution of hydrofluoric acid and nitric acid, and (c) a mixed solution of hydrofluoric acid, nitric acid, and acetic acid.

In the porous region removing method, an ultrasonic wave is preferably supplied to the substrate during at least part of an overall period of execution of the first and second steps.

In the porous region removing method, the first step preferably comprises supplying an ultrasonic wave to the substrate.

In the porous region removing method, an ultrasonic wave is preferably supplied to the substrate during at least part of an overall period of execution of the second step.

In the porous region removing method, an ultrasonic wave is preferably supplied to the substrate during at least part of an overall period of execution of the second step, in which the first process solution filling the porous region is replaced with the second process solution.

In the porous region removing method, the second step preferably comprises the steps of etching the porous region without supplying any ultrasonic wave to the substrate until the pore walls in the porous region have not more than a predetermined thickness, and etching the porous region remaining on the substrate while supplying an ultrasonic wave to the substrate, thereby removing the porous region.

In the porous region removing method, the second step preferably comprises the steps of replacing the first process solution filling the porous region with the second process solution while supplying an ultrasonic wave to the substrate, etching the porous region without supplying any ultrasonic wave to the substrate until the pore walls in the porous region have not more than a predetermined thickness, and etching the porous region remaining on the substrate while supplying an ultrasonic wave to the substrate, thereby removing the porous region.

The porous region removing method preferably further comprises, after the second step, the third step of removing the porous region remaining on the substrate.

In the porous region removing method, the third step preferably comprises removing the porous region remaining on the substrate using an etchant.

In the porous region removing method, the third step preferably comprises removing the porous region remaining on the substrate using the etchant while supplying the ultrasonic wave to the substrate.

In the porous region removing method, the second and third steps are preferably executed while dipping the substrate to be processed in the same etchant.

In the porous region removing method, the third step preferably comprises removing the porous region remaining on the substrate using a third process solution whose etching rate for the porous material is higher than that of the second process solution.

In the porous region removing method, the third step preferably comprises removing the porous region remaining on the substrate using a high-pressure fluid.

In the porous region removing method, the third step preferably comprises removing the porous region remaining on the substrate by polishing.

In the porous region removing method, the third step preferably comprises removing the porous region remaining on the substrate by scrubbing.

In the porous region removing method, in processing the substrate while supplying the ultrasonic wave to the substrate, a relative positional relationship between the substrate and an ultrasonic source is preferably changed.

In the porous region removing method, in processing the substrate while supplying the ultrasonic wave to the substrate, the substrate is preferably swung in the process solution.

In the porous region removing method, in processing the substrate while supplying the ultrasonic wave to the substrate, a position of at least one of the substrate and the ultrasonic source is preferably changed in a direction substantially parallel or perpendicular to a vibration plane of the ultrasonic wave.

In the porous region removing method, the first and/or second step preferably comprises changing a relative positional relationship between the substrate and the ultrasonic source.

In the porous region removing method, all or some of the first to third steps preferably comprise changing a relative positional relationship between the substrate and the ultrasonic source.

In the porous region removing method, the first and/or second steps preferably comprises circulating the process solution to form a flow of the process solution near the substrate.

In the porous region removing method, all or some of the first to third steps preferably comprise circulating the process solution to form a flow of the process solution near the substrate.

In the porous region removing method, supply of the ultrasonic wave to the substrate is preferably controlled by operating or stopping the ultrasonic source.

In the porous region removing method, supply of the ultrasonic wave to the substrate is preferably controlled by inserting an ultrasonic wave shielding plate between the ultrasonic source and the substrate.

According to the present invention, there is also provided a method of manufacturing a semiconductor substrate, characterized by comprising the steps of forming a porous layer and at least one non-porous layer on a first substrate, bonding a second substrate to the non-porous layer side of the first substrate, removing the first substrate from the bonded substrate stack to expose the porous layer on a surface of the second substrate, and removing the porous layer on the second substrate using the above porous region removing method.

In the semiconductor substrate manufacturing method, the step of exposing the porous layer preferably comprises grinding, polishing, or etching the first substrate from a lower surface side of the bonded first substrate to expose the porous layer on the surface of the second substrate.

In the semiconductor substrate manufacturing method, the step of exposing the porous layer preferably comprises dividing the bonded substrate stack at the porous layer to expose the porous layer on the surface of the second substrate.

In the semiconductor substrate manufacturing method, the non-porous layer preferably includes a single-crystal Si layer.

In the semiconductor substrate manufacturing method, the non-porous layer preferably includes a single-crystal Si layer and an Si oxide layer.

In the semiconductor substrate manufacturing method, the single-crystal Si layer is preferably a layer epitaxially grown on the porous layer of the first substrate.

In the semiconductor substrate manufacturing method, the non-porous layer preferably includes a single-crystal compound semiconductor layer.

In the semiconductor substrate manufacturing method, the second substrate preferably essentially consists of an Si material.

In the semiconductor substrate manufacturing method, the second substrate preferably has an Si oxide layer on a surface to be bonded to the first substrate.

In the semiconductor substrate manufacturing method, the second substrate is preferably a transparent substrate.

According to the present invention, there is also provided a porous region removing apparatus for removing a porous region from a substrate having the porous region, characterized by comprising means for executing the first step of filling the porous region with a first process solution having no etching function or weak etching function for a porous material, and means for executing the second step of replacing the first process solution filling the porous region with the second process solution having an etching function for a porous material to etch the porous region.

Further objects, features and advantages of the present invention will become apparent from the following detailed description of embodiments of the present invention with reference to the accompanying drawings.

BRIEF DESCRIPTION OF THE DRAWINGS

FIG. 4 is a perspective view showing the first arrangement of a wafer processing apparatus;

FIG. 13 is a view showing the seventh arrangement of the wafer processing apparatus.

DETAILED DESCRIPTION OF THE PREFERRED EMBODIMENT

Figure 1A:
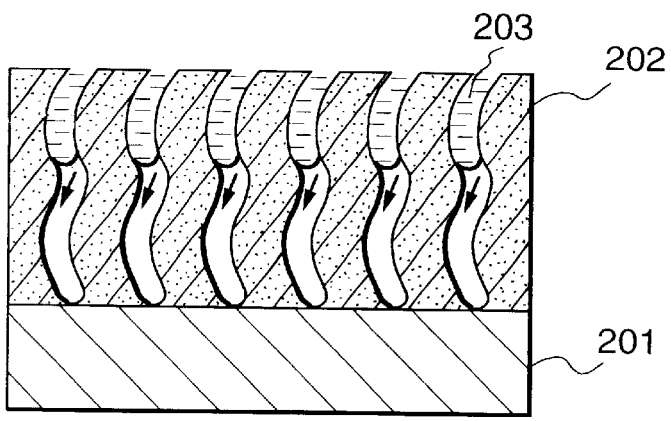
FIGS. 1A to 1D are views for explaining the principle of a porous layer removing method according to a preferred embodiment of the present invention.

The present invention is suitable for a method of sequentially forming a porous layer and a non-porous layer on a first substrate, bonding the first substrate to a separately prepared second substrate, separating the bonded substrate stack into two substrates at the porous layer to transfer the non-porous layer formed on the first substrate side to the second substrate side, and removing the porous layer remaining on the surface on the second substrate side, thereby manufacturing an SOI substrate.

As the first substrate, a single-crystal Si substrate can be used. In this case, the porous layer is a porous Si layer. on the porous Si layer, a single-crystal Si layer can be epitaxially grown as a non-porous layer. An insulating layer such as an $SiO_2$ layer may be formed on the single-crystal Si layer.

In the embodiment, the porous layer and the non-porous layer are sequentially formed on the first substrate, and this substrate is bonded to the separately prepared second substrate to form a bonded substrate stack. After the bonded substrate stack is separated into two substrates at the porous layer, the porous layer remaining on the second substrate side is removed by, e.g., wet etching.

More specifically, in this embodiment, to remove the porous layer remaining on the second substrate side after separation, pores in the porous layer are filled with a solution which does not etch the porous material or a solution whose etching rate for the porous material is low (to be referred to as a preprocess solution hereinafter). After the pores in the porous layer are sufficiently filled with the preprocess solution, the preprocess solution is replaced with an etchant having an etching function for the porous material. The pore walls of the porous layer are etched by this etchant.

According to this method, the time (to be referred to as a filling time hereinafter) required to fill each pore in the porous layer with the etchant to the deepest portion can be shortened, and consequently, the filling time for the pores can substantially be uniformed. Hence, variations in surface of the second substrate or variations between substrates after removal of the porous layer can be suppressed, so a high-quality substrate (e.g., an SOI substrate) whose surface layer has high film thickness uniformity can be manufactured.

When the pores in the porous layer are filled with the etchant without filling them with the preprocess solution, gas in the pores in the porous layer is replaced with the etchant, and this requires a long filling time. For this reason, the filling time for the pores readily varies, and as a consequence, progress of etching in the pores readily varies. This variation may lower the yield of mass production.

In this embodiment, water is preferably used as the preprocess solution. When water is employed as the preprocess solution, the influence of the preprocess solution on the etchant which replaces the preprocess solution is small, and degradation of the etchant can be suppressed.

When the porous material is Si, not only water but also a solution having an oxidation function, e.g., hydrogen peroxide, nitric acid, or hydrochloric acid can be used. As the etchant, hydrofluoric acid can be used.

FIGS. 1A to 1D are views for explaining the principle of a porous layer removing method according to a preferred embodiment of the present invention. Referring to FIGS. 1A to 1D, reference numeral 201 denotes an underlying substrate (second substrate); 202, a porous layer; and 203, a preprocess solution; and 204, an etchant.

In FIG. 1A, the pores of the porous layer 202 are filled with the preprocess solution 203 to the deepest portions. At this time, an ultrasonic wave is preferably supplied to the object (e.g., a bonded substrate stack) to be processed. When an ultrasonic wave is supplied, the speed at which the pores are filled with the preprocess solution increases.

Figure 1B:
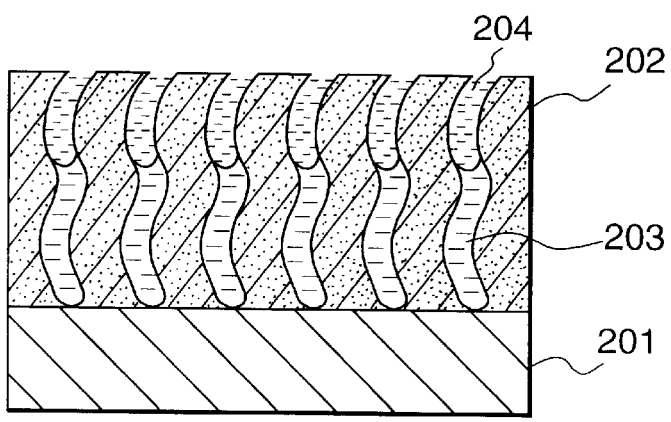

After each pore in the porous layer 202 is filled with the preprocess solution 203 to the deepest portion, in the step shown in FIG. 1B, the preprocess solution 203 is replaced with the etchant 204. In this specification, "replacement" also includes a case wherein ions (e.g., fluorine or hydrogen ions) in the etchant (e.g., hydrofluoric acid) 204 diffuse in the preprocess solution (e.g., water) 203 to fill the pores with the etchant 204. During execution of this step, an ultrasonic wave is preferably supplied to the object to be processed. By supplying the ultrasonic wave, the preprocess solution 203 can be quickly replaced with the etchant 204.

As described above, when the pores in the porous layer 202 are filled with the preprocess solution 203, and then, the preprocess solution 203 is replaced with the etchant 204, the pores in the porous layer 202 can be quickly filled with the etchant. Consequently, an etching variation due to variation in filling time can be suppressed.

Figure 1C:
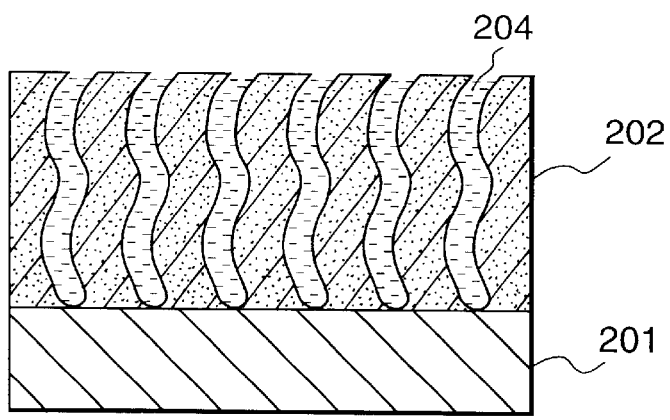

In FIG. 1C, the pores in the porous layer 202 grow by the etching function. At this time, preferably, supply of the ultrasonic wave is stopped, or the ultrasonic power is reduced. The reason for this is as follows.

The porous layer starts to break as soon as the pore walls have a predetermined thickness. Since the porous layer breaks first at thin portions, the surface of the underlying substrate 201 is etched in these portions. In this case, apparently the planarity of the substrate 201 degrades. If the underlying layer is a film, film thickness uniformity in the surface or between substrates suffers. However, when supply of the ultrasonic wave is stopped while the pores in the porous layer 202 grow, as described above, the pores do not break unless they become much thinner than in a case wherein supply of the ultrasonic wave is not stopped. In this case, therefore, etching can be prevented from locally excessively progressing.

Even when no ultrasonic wave is supplied to the object to be processed, etching progresses not only in the horizontal direction (planar direction) but also in the vertical direction. However, the influence on etching is negligible compared to the case wherein an ultrasonic wave is supplied.

Figure 1D:
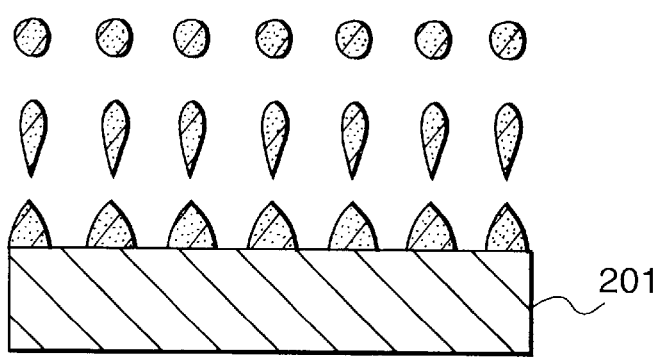

In FIG. 1D, the porous layer 202 with thin pore walls is removed. Not only etching but also polishing, scrubbing, or the water jet method can be applied to this step. In this step, the porous layer having a fragile structure upon etching is removed at once.

When etching is applied to the step shown in FIG. 1D, the steps in FIGS. 1B to 1D can be executed using the same etching tank. In this case, in the step shown in FIG. 1C, supply of the ultrasonic wave is temporarily stopped, and processing waits until pore walls at the deepest portion of the porous layer become thin enough to immediately break in the entire region upon resupply of an ultrasonic wave, and then, the step in FIG. 1D is executed (etching while supplying the ultrasonic wave). With this process, the porous layer can be removed at once, and almost simultaneously, the underlying substrate 201 can be exposed in the entire region of the object to be processed. For this reason, variations in etching can be reduced, and a high planarity of the underlying substrate 201 can be maintained.

The above porous layer removing method can be easily applied to batch processing of a number of substrates. More specifically, for each of a number of objects to be processed, after the pore walls at the deepest portion of the porous layer are thinned to immediately break in the entire region in the step shown in FIG. 1C, the step shown in FIG. 1D is executed.

This porous layer removing method is preferably practiced while completely dipping the object to be processed in the etchant. In this case, particles can be prevented from sticking to the object to be processed near the interface between the etchant and air.

According to this porous layer removing method, by supplying an ultrasonic wave, etching is prompted to break the porous layer, and particles can be efficiently removed from the object to be processed.

When the porous layer is removed while changing the relative positional relationship between the ultrasonic source (e.g., an ultrasonic vibrator) and the object to be processed and, more specifically, the positional relationship between the substrate and a standing wave generated between the ultrasonic vibration surface and the liquid surface of the etchant, processing can be uniformly performed in all regions of the substrate surface. To do this, for example, the substrate is rotated, the substrate is swung, a carrier holding the substrate is swung, or the ultrasonic source is moved.

Application examples of the porous layer removing method will be described below.

(First Application Example)

Figure 2A:
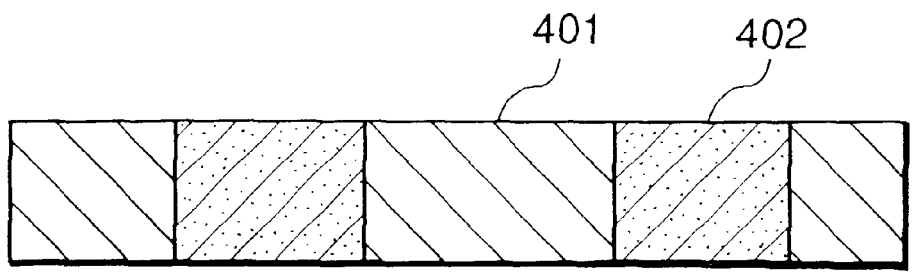
FIGS. 2A to 2C are views showing a fabrication method according to the first application example of the porous layer removing method.
Figure 2B:
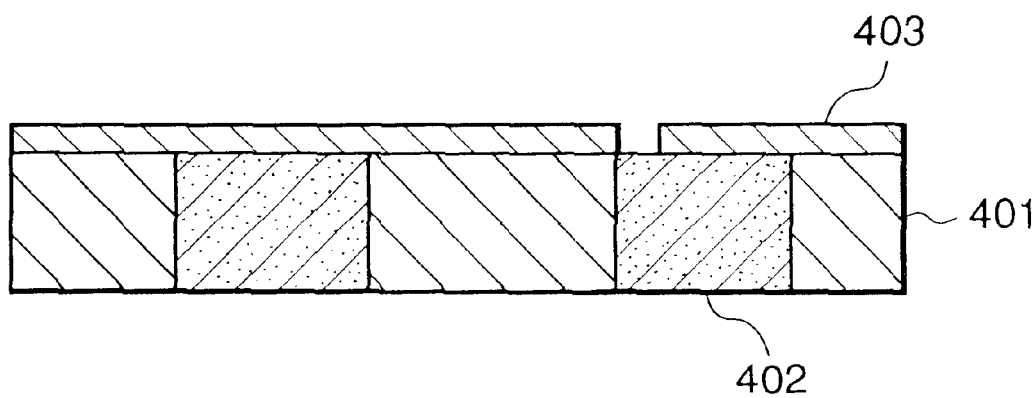
Figure 2C:
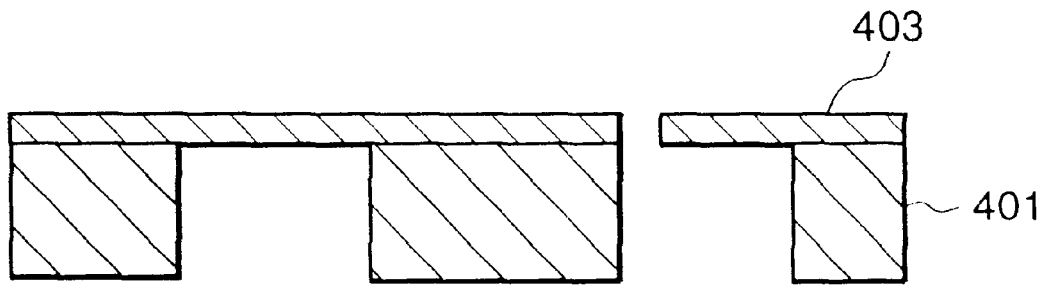

The first application example is associated with an object fabrication method. FIGS. 2A to 2C are views showing the fabrication method of this application example. In FIG. 2A, an Si substrate 401 locally having porous Si portions 402 is prepared. The Si substrate 401 is obtained by, e.g., forming a resist film on the Si substrate, patterning the resist film by lithography, and anodizing the resultant structure. In place of the resist film, a patterned $Si_3 N_4$ film or wax may be employed. As this wax, wax having hydrofluoric acid resistance, e.g., Apizoen wax (trade name) can be used.

In FIG. 2C, the porous Si portion 402 is removed. More specifically, the substrate shown in FIG. 2B is set in a processing tank filled with the preprocess solution (e.g., pure water) to fill pores in the porous Si portion 402 with the preprocess solution. At this time, to shorten the filling time, an ultrasonic wave is preferably supplied to the substrate.

Subsequently, the substrate in which the pores in the porous Si portion 402 are filled with the preprocess solution is set in an etching tank filled with an etchant (e.g., fluoric acid). The preprocess solution in the pores in the porous Si portion 402 is replaced with the etchant to etch the pore walls in the porous Si portion 402. To accelerate etching, an ultrasonic wave is preferably supplied to the substrate. On the other hand, to suppress variations in the progress of etching, supply of the ultrasonic wave is preferably stopped after the preprocess solution is replaced with the etchant.

In this etching process, the pore walls in the porous Si portions 402 gradually thin. The color of porous Si portions 402 also gradually becomes lighter when viewed from the surface (lower side of the drawing). When the pore walls have sufficiently thinned, an underlying non-porous layer (pattern) 403 can be seen through the porous Si portions 402.

In this state, the remaining porous Si portions are removed. To remove the porous Si portions, for example, 1) etching is performed while resupplying the ultrasonic wave, or 2) etching is performed using an etchant with high Si etching rate.

To leave a hard structure, the porous Si portions may be removed by a jet of water.

When the entire Si substrate 401 is made of porous Si, only the non-porous layer formed on the substrate can be left. In addition, when the non-porous layer 403 is patterned, as described above, various structures including a cantilever shown in FIG. 2C can be formed.

(Second Application Example)

Figure 3A:
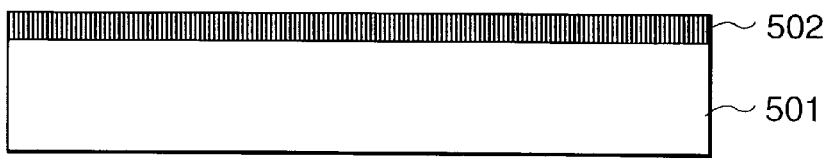
FIGS. 3A to 3F are views showing a semiconductor substrate manufacturing method according to another preferred embodiment of the present invention.
Figure 3B:
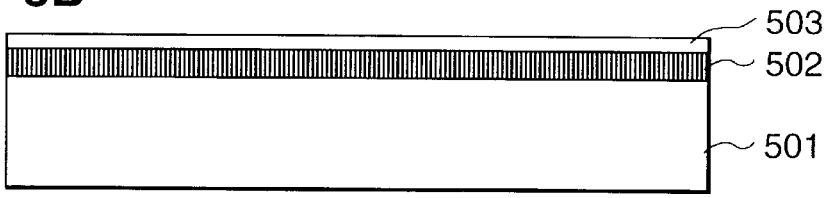

The second application example is associated with a semiconductor substrate manufacturing method. FIGS. 3A to 3F show the semiconductor substrate manufacturing method of this application example. In FIG. 3A, a first single-crystal Si substrate 501 is prepared, and a porous Si layer 502 is formed on one surface of the first single-crystal Si substrate 501. In FIG. 3B, at least one non-porous layer 503 is formed on the porous Si layer 502. As the non-porous layer 503, a single-crystal Si layer, a polycrystalline Si layer, an amorphous Si layer, a metal layer, a compound semiconductor layer, or a superconductor layer is suitable. As the non-porous layer 503, a layer including a device structure such as a MOSFET may be formed. An $SiO_2$ layer 504 is preferably formed on the surface layer, thus completing the first substrate. This $SiO_2$ layer 504 is useful because when the first substrate is bonded to a second substrate 505, the interface states of the bonding interface can be separated from the active layer.

Figure 3C:
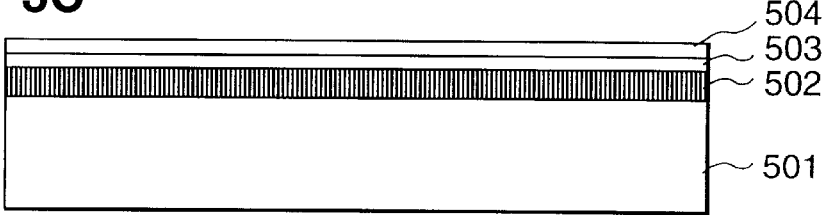
Figure 3D:
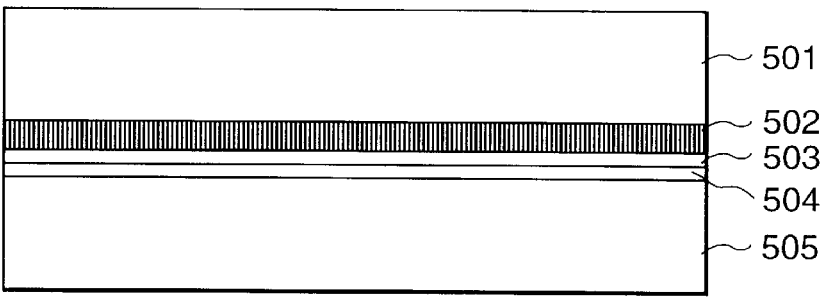

Subsequently, as shown in FIG. 3D, the separately prepared second substrate 505 is brought into contact with the first substrate shown in FIG. 3C at room temperature via the $SiO_2$ layer 504. After this, anode bonding, pressing, a heat treatment as needed, or a combination thereof is performed to firmly bond the substrates.

When a single-crystal Si layer is formed as the non-porous layer 503, the first substrate is preferably bonded to the second substrate 505 after the $SiO_2$ layer 504 is formed on the surface of the single-crystal Si layer by, e.g., thermal oxidation.

As the second substrate 505, an Si substrate, a substrate obtained by forming an $SiO_2$ layer on an Si substrate, a transparent substrate consisting of silica glass, or quartz or a sapphire substrate is suitable. Any other substrate can be used as far as the second substrate 505 has a sufficiently flat surface to be bonded.

FIG. 3D shows a state wherein the first substrate and the second substrate are bonded via the $SiO_2$ layer 504. If the non-porous layer 503 or the second substrate does not consist of Si, the $SiO_2$ layer 504 need not be formed.

In bonding, an insulating thin plate may be inserted between the first substrate and the second substrate.

Figure 3E:
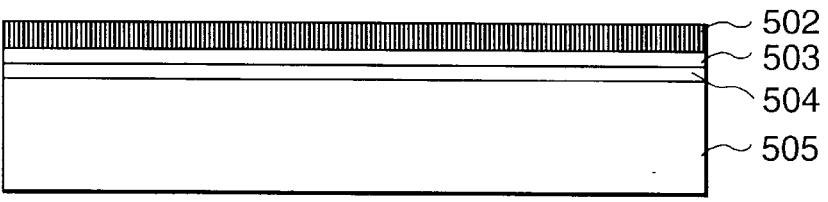

In FIG. 3E, the first Si substrate 501 is removed from the second substrate side at the porous Si layer 502. To remove the first substrate, the first substrate side is discarded by grinding, polishing, or etching, or the bonded substrate stack is separated into the first substrate side and the second substrate at the porous Si layer 502.

Figure 3F:
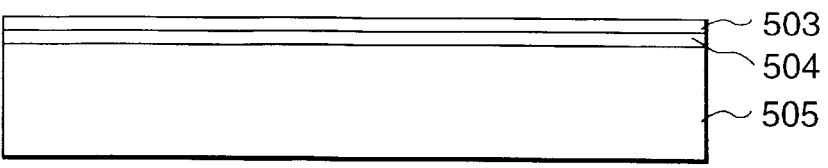

In FIG. 3F, the porous Si layer 502 remaining on the surface on the second substrate side is removed. More specifically, the second substrate side shown in FIG. 3E is set in a processing tank filled with the preprocess solution to fill pores in the porous Si layer 502 with the preprocess solution. At this time, to shorten the filling time, an ultrasonic wave is preferably supplied to the substrate. As the preprocess solution, not only pure water but also a solution containing hydrogen peroxide, nitric acid, or hydrochloric acid having an oxidation function can be used.

Subsequently, the substrate in which the pores in the porous Si layer 502 are filled with the preprocess solution is set in an etching tank filled with an etchant. The preprocess solution in the pores in the porous Si layer 502 is replaced with the etchant to etch the pore walls in the porous Si layer 502. To accelerate etching, an ultrasonic wave is preferably supplied to the substrate. On the other hand, to suppress variations in the progress of etching, supply of the ultrasonic wave is preferably stopped after the preprocess solution is replaced with the etchant. As the etchant, hydrofluoric acid can be used.

In this etching process, the pore walls in the porous Si layer 502 gradually thin. The color of porous Si layer 502 also gradually becomes lighter when viewed from the surface. When the pore walls have sufficiently thinned, the underlying non-porous layer (e.g., a single-crystal Si layer) 503 can be seen through the porous Si layer 502.

In this state, the remaining porous Si layer 502 is removed. To remove the porous Si layer, for example, 1) etching is performed while resupplying an ultrasonic wave, 2) etching is performed using an etchant with high Si etching rate, 3) the porous Si layer 502 is removed by a water jet, 4) the porous Si layer 502 is polished, or 5) scrubbing is performed.

FIG. 3F is a view schematically showing a semiconductor substrate (SOI substrate) obtained by the above method. The non-porous layer (e.g., a single-crystal Si layer) 503 with a flat surface and uniform film thickness is formed on the second substrate 505 via the insulating layer (e.g., an $SiO_2$ layer) 504. According to this method, a large-area semiconductor substrate having high quality can be manufactured.

When an insulating substrate is employed as the second substrate 505, the semiconductor substrate obtained by the above manufacturing method is very useful to form an insulated electronic device.

When the bonded substrate stack shown in FIG. 3D is divided at the porous Si layer 502, the first substrate can be reused after the porous Si layer 502 remaining on the first substrate 501 is removed, and the surface is planarized, as needed.

Specific examples of a wafer processing apparatus suitable to remove a porous layer will be listed below.

Wafer processing apparatuses to be described below can be used for both of the step (preprocess) of filling pores in the porous layer with the preprocess solution and the step (main process) of replacing the preprocess solution with the etchant to perform etching. One wafer processing apparatus may be used for both of the preprocess and the main process by exchanging the process solution. Alternatively, a wafer processing apparatus for the preprocess and that for the main process may be separately prepared.

(First Arrangement of Processing Apparatus)

FIG. 4 is a perspective view showing the schematic arrangement of a wafer processing apparatus suitable to remove a porous layer.

In a wafer processing apparatus 100, members which may come into contact with the process solution are preferably made of silica glass or a plastic in accordance with their application purposes. As the plastic, a fluoroplastic, vinyl chloride, polyethylene, polypropylene, polybutylene terephthalate (PBT), or polyether ether ketone (PEEK) can be used. As the fluoroplastic, PVDF, PFA, or PTFE is suitable.

The wafer processing apparatus 100 comprises a wafer processing tank 110, an overflow tank 120, an ultrasonic tank 130, and a wafer rotating mechanism (111 to 119) for supporting wafers 140 while rotating them.

Before processing wafers, the wafer processing tank 110 is filled with a process solution (preprocess solution or etchant). The overflow tank 120 for temporarily storing the process solution overflowing from the wafer processing tank 110 is mounted on the upper portion around the wafer processing tank 110 to surround it. The process solution temporarily stored in the overflow tank 120 is discharged from the bottom portion of the overflow tank 120 to a circulator 121 through a discharge pipe 121a. The circulator 121 filters the discharged process solution to remove particles and sends the process solution to the bottom portion of the wafer processing tank 110 through a supply pipe 121b. With this arrangement, particles in the wafer processing tank 110 are efficiently removed.

The wafer processing tank 110 preferably has a depth with which the wafers 140 can be completely immersed. With this arrangement, particles in the air or near the liquid surface can be prevented from adhering to the wafers 140.

The ultrasonic tank 130 is located under the wafer processing tank 110. Inside the ultrasonic tank 130, an ultrasonic source 131 is supported by an adjustment mechanism 132. The adjustment mechanism 132 has, as mechanisms for adjusting the relative positional relationship between the ultrasonic source 131 and the wafer processing tank 110 has a mechanism, a mechanism for adjusting the vertical position of the ultrasonic source 131 and a mechanism for adjusting the horizontal position. With this mechanism, the ultrasonic wave to be supplied into the wafer processing tank 110 and, more specifically, to the wafers 140 can be optimized. The ultrasonic source 131 preferably has a function of adjusting the frequency or strength of the generated ultrasonic wave. With this arrangement, supply of an ultrasonic wave can be further optimized. By imparting the function of optimizing supply of an ultrasonic wave to the wafers 140, the ultrasonic wave can be supplied individually to a variety of types of wafers. The ultrasonic tank 130 is filled with an ultrasonic transmission medium (e.g., water), so the ultrasonic wave is transmitted to the wafer processing tank 110 through the ultrasonic transmission medium.

The wafer processing apparatus 100 has a control section for ON/OFF-controlling the ultrasonic source 131. With this control section, porous layer removing processing can be controlled.

The wafers 140 are held to be almost perpendicular to the bottom surface of the wafer processing tank 110 by four wafer rotary rods 111 each having grooves 111a engaging with the wafers 140. The wafer rotary rods 111 have a function of supporting the wafers 140 while rotating them and constitute part of the wafer rotating mechanism. Each wafer rotary rod 111 is pivotally supported by a pair of rod support members 118 opposite to each other, so the wafer rotary rods 111 rotate in the same direction upon receiving a driving torque generated by a motor 119. Each wafer rotary rod 111 preferably has a small diameter not to impede transmission of the ultrasonic wave.

The number of wafer rotary rods 111 is preferably as small as possible. To ensure a desired frictional force with respect to the wafers 140, preferably, two wafer rotary rods 111 for limiting movement in the rolling direction (X-axis direction) of the wafers 140, and two wafer rotary rods 111 for supporting the wafers 140 from the lower side are provided. When two wafer rotary rods 111 are disposed at an appropriate interval below the wafers, the driving torque can be efficiently transmitted to the wafers having an orientation flat. If only one wafer rotary rod 111 is placed below the wafers, and the orientation flat is positioned above this wafer rotary rod 111, the wafers cannot be rotated by the wafer rotary rod 111.

Normally, a standing wave, i.e., an ultrasonic wave having a high-strength portion and a low-strength portion is formed between the bottom surface of the wafer processing tank 110 and the liquid surface. However, since this wafer processing apparatus 100 can process the wafers 140 while rotating them, nonuniformity in processing due to the standing wave can be reduced.

In the wafer processing apparatus 100, the number of members on the bottom portion of the wafer processing tank 110 or around the wafers 140 is decreased as small as possible. For this reason, the ultrasonic wave can be efficiently and uniformly supplied to the wafers 140. In addition, with this arrangement, since the process solution can freely flow around the wafers 140, the wafers can be uniformly processed, and processing defects can be prevented.

(Second Arrangement of Wafer Processing Apparatus)

Figure 5:
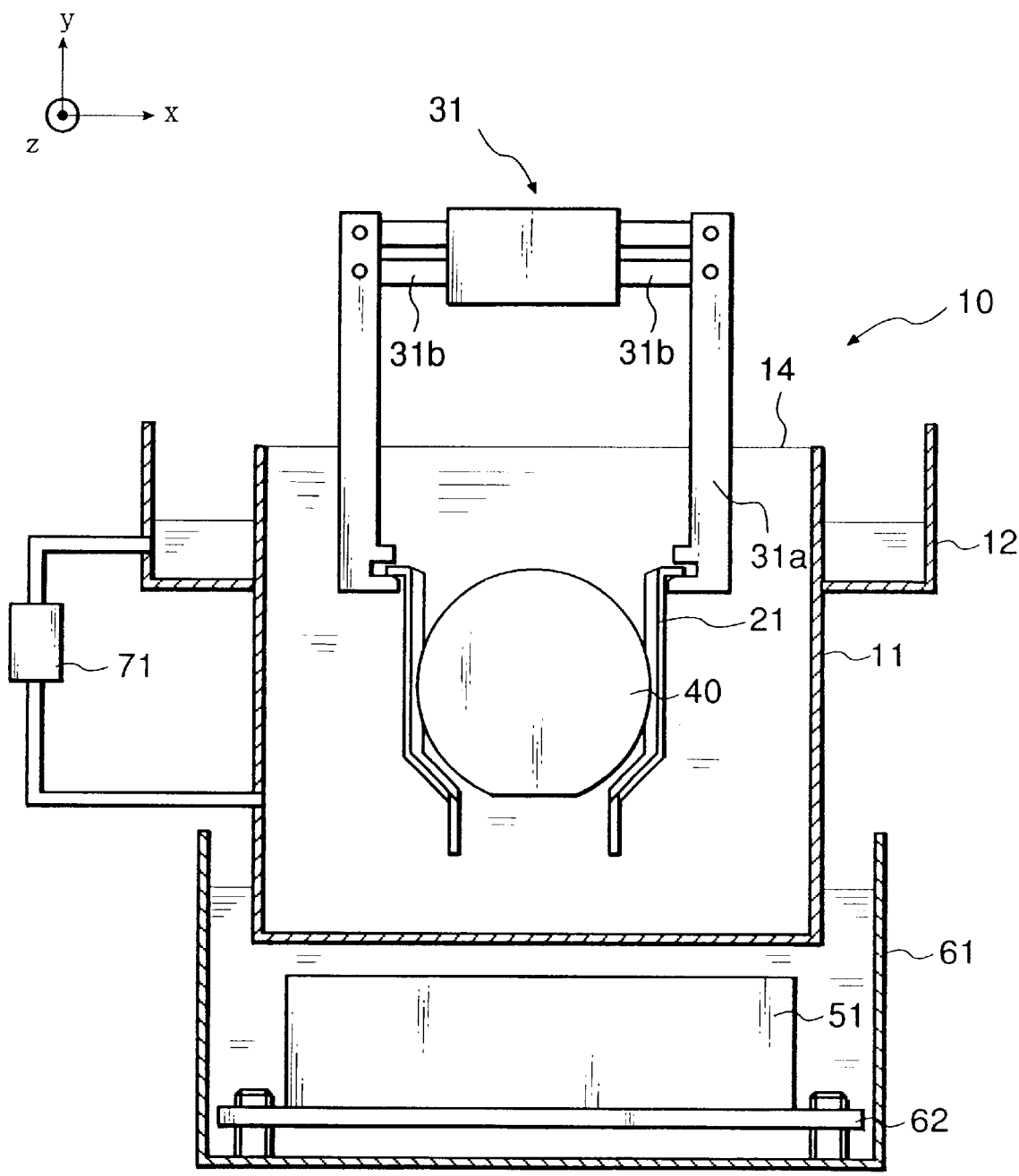
FIG. 5 is a perspective view showing the second arrangement of the wafer processing apparatus.

FIG. 5 is a view showing the schematic arrangement of a wafer processing apparatus suitable to remove a porous layer.

In a wafer processing apparatus 10, members which may come into contact with the process solution are preferably made of silica glass or a plastic in accordance with their application purposes. As the plastic, a fluoroplastic, vinyl chloride, polyethylene, polypropylene, polybutylene terephthalate (PBT), or polyether ether ketone (PEEK) can be used. As the fluoroplastic, PVDF, PFA, or PTFE is suitable.

The wafer processing apparatus 10 comprises a wafer processing tank 11, and a holder driving mechanism 31 for swinging a wafer holder 21 in the wafer processing tank 11. The wafer processing apparatus 10 preferably has an ultrasonic tank 61.

Before processing wafers, the wafer processing tank 11 is filled with a process solution (preprocess solution or etchant). The wafer processing tank 11 has a four-side overflow tank 12. The process solution is supplied by a circulator 71 with a filter from the bottom portion of the wafer processing tank 11 into the wafer processing tank 11. The process solution overflowing from the wafer processing tank 11 is stored in the four-side overflow tank 12 and discharged from the bottom portion of the four-side overflow tank 12 to the circulator 71. In this wafer processing apparatus 10, the wafer holder 21 is swung by the holder driving mechanism 31, and simultaneously, the process solution is stirred. For this reason, the circulating system including the four-side overflow tank 12 is very useful to maintain a constant liquid surface of the process solution.

As the wafer holder 21, a commercially available product can be used. The wafer holder 21 is preferably made of silica glass or a plastic. As the plastic, a fluoroplastic, vinyl chloride, polyethylene, polypropylene, polybutylene terephthalate (PBT), or polyether ether ketone (PEEK) can be used. As the fluoroplastic, PVDF, PFA, or PTFE is suitable.

The holder driving mechanism 31 has a pair of holding portions 31a for holding the wafer holder 21. The wafer holder 21 is held by the pair of holding portion 31a and dipped in the wafer processing tank 11. Desired processing can be performed for a wafer 40 while swinging the wafer holder 21 in the wafer processing tank 11. The holder driving mechanism 31 has a function of conveying the wafer holder 21 storing wafers 40 which have been processed in the preceding step to the wafer processing tank 11 or to the next step. The holder driving mechanism 31 also has a function as part of the wafer processing apparatus 10.

In this embodiment, the holding portions 31a hold the wafer holder 21, so the wafer 40 is indirectly held. However, the holding portions 31a may be replaced with, e.g., chuck pads to directly hold the wafer 40. The direction in which the wafer 40 is held is not limited to the direction perpendicular to the bottom surface of the wafer processing tank 11 and may be parallel to the bottom surface.

The ultrasonic tank 61 has an ultrasonic source 51 and is filled with an ultrasonic transmission medium (e.g., water). The ultrasonic source 51 is fixed on an adjustment mechanism 62 for adjusting the vertical and/or horizontal position of the ultrasonic source 51. When the positional relationship between the ultrasonic source 51 and the wafer processing tank 11 is adjusted by the adjustment mechanism 62, the ultrasonic wave to be supplied to the wafer processing tank 11 and, more specifically, to the wafer 40 can be optimized. The ultrasonic source 51 preferably has a function of adjusting the frequency or strength of the generated ultrasonic wave. With this arrangement, supply of an ultrasonic wave can be further optimized. By imparting the function of optimizing supply of an ultrasonic wave to the wafer 40, the ultrasonic wave can be supplied individually to a variety of types of wafers.

The wafer processing apparatus 10 has a control section for ON/OFF-controlling the ultrasonic source 51. With this control section, porous layer removing processing can be controlled.

(Third Arrangement of Wafer Processing Apparatus)

Figure 6:
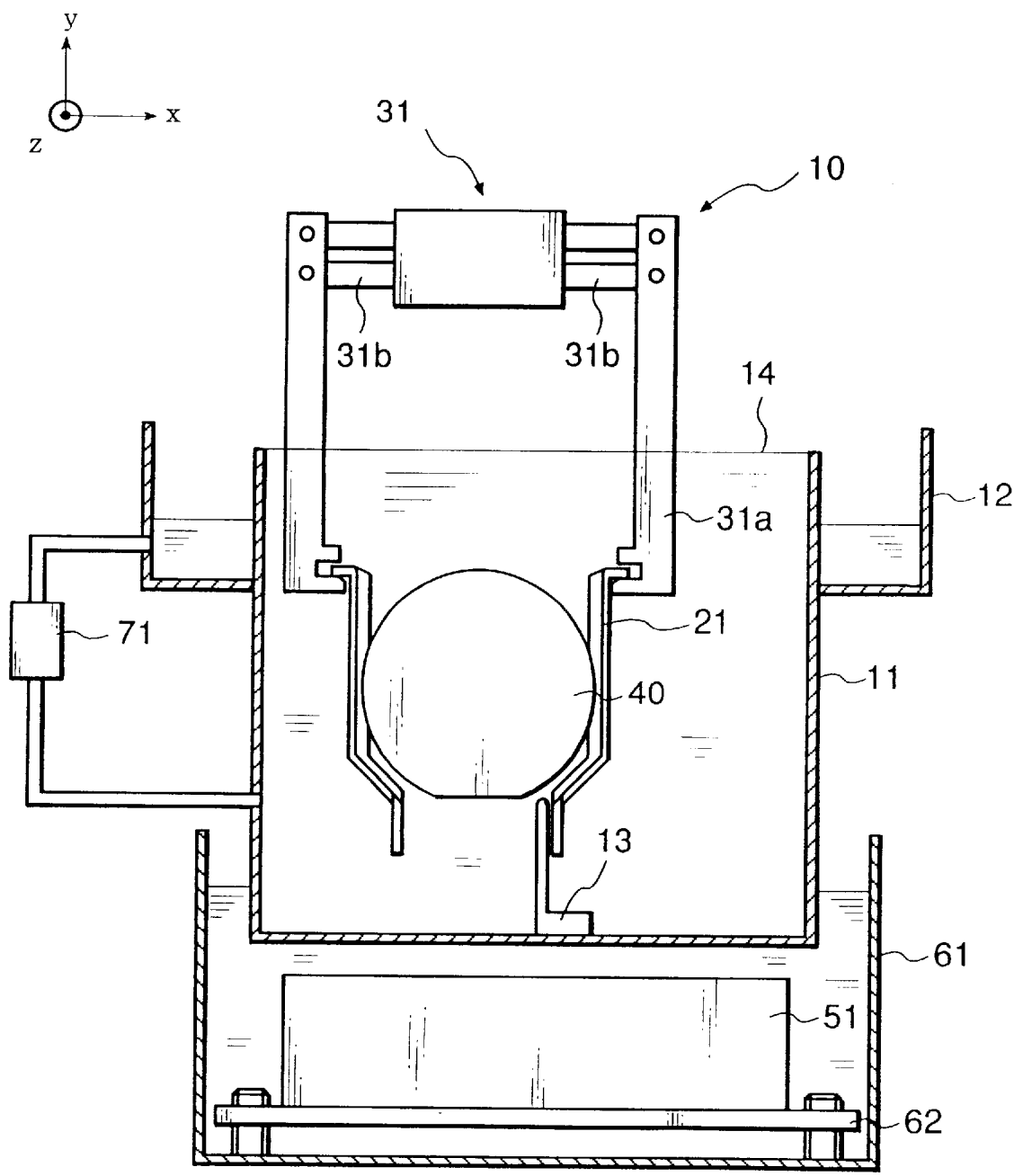
FIG. 6 is a perspective view showing the third arrangement of the wafer processing apparatus.

FIG. 6 is a view showing the schematic arrangement of a wafer processing apparatus suitable to remove a porous layer. FIGS. 7A to 7E are views showing operation of the wafer processing apparatus shown in FIG. 6. FIG. 8 is a perspective view of a swing assist member in the wafer processing apparatus shown in FIG. 6.

The wafer processing tank 11 preferably has, on the bottom surface, a swing assist member 13 for increasing the efficiency of swing of the wafer 40 by the holder driving mechanism 31. The swing assist member 13 comes into contact with the side surface of the wafer 40 held by the wafer holder 21 when the wafer holder 21 moves, thereby rotating and vertically moving the wafer 40 in the wafer holder 21 by the frictional force. The swing assist member 13 is useful to improve the surface uniformity of the processed wafer.

It is also effective to use a driving mechanism for vertically (Y-axis direction) and/or horizontally (X-axis direction) moving the swing assist member 13. In this case, the swing assist member 13 itself moves to rotate the wafer 40 and vertically move the wafer 40 in the wafer holder 21. Therefore, the range in which the holder driving mechanism 31 moves the wafer holder 21 can be made small. In other words, the wafer processing tank 11 can be made compact.

The ultrasonic tank 61 has the ultrasonic source 51 and is filled with an ultrasonic transmission medium (e.g., water). The ultrasonic source 51 is fixed on the adjustment mechanism 62 for adjusting the vertical and/or horizontal position of the ultrasonic source 51. When the positional relationship between the ultrasonic source 51 and the wafer processing tank 11 is adjusted by the adjustment mechanism 62, the ultrasonic wave to be supplied to the wafer processing tank 11 and, more specifically, to the wafer 40 can be optimized. The ultrasonic source 51 preferably has a function of adjusting the frequency or strength of the generated ultrasonic wave. With this arrangement, supply of an ultrasonic wave can be further optimized. By imparting the function of optimizing supply of an ultrasonic wave to the wafer 40, the ultrasonic wave can be supplied individually to a variety of types of wafers.

The wafer processing apparatus 10 has a control section for ON/OFF-controlling the ultrasonic source 51. With this control section, porous layer removing processing can be controlled.

Figure 7A:
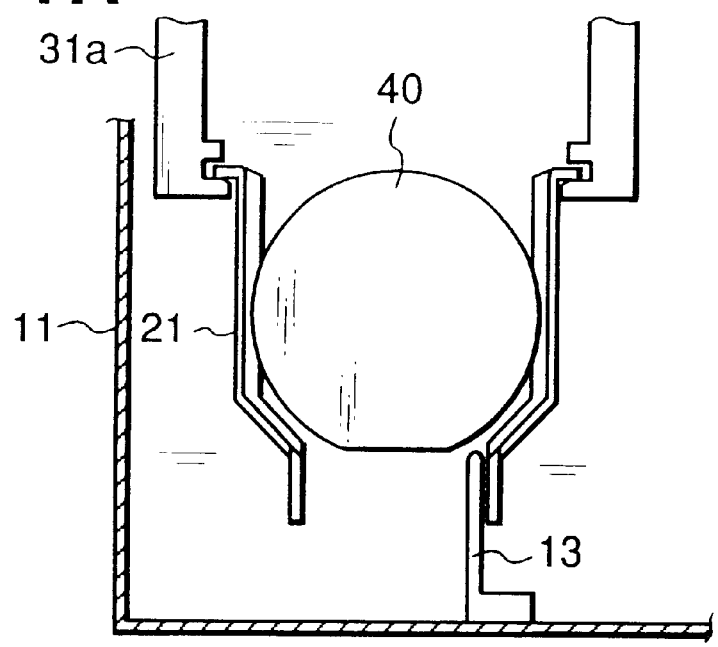
FIGS. 7A to 7E are views showing operation of the wafer processing apparatus shown in FIG. 6.
Figure 7B:
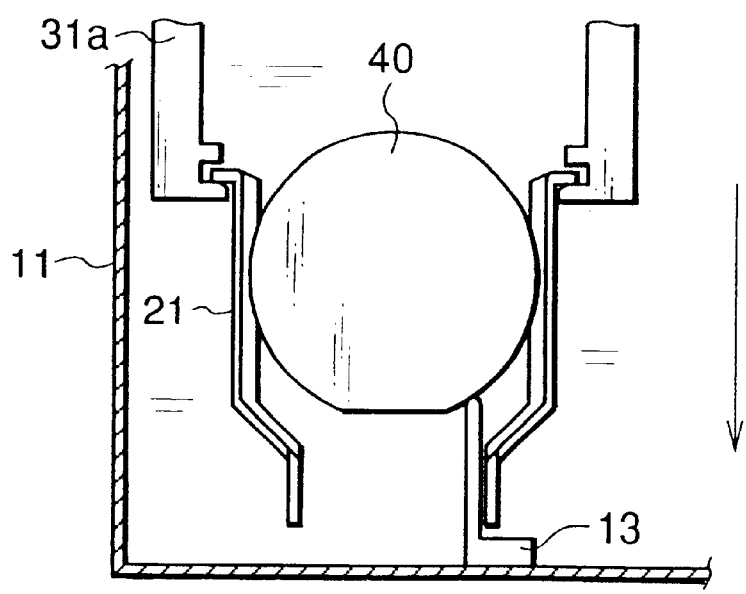

FIGS. 7A to 7E are views for explaining a wafer swing method. In these drawings, arrows indicate the moving directions of the wafer holder 21. FIG. 7A shows a state immediately before the wafer starts to be swung. When the start of wafer swing operation is instructed, the holder driving mechanism 31 presses the holding portions 31a downward under computer control, as shown in FIG. 7B. The side surface of the wafer 40 comes into contact with the swing assist member 13 midway this pressing. The wafer 40 is supported by the swing assist member 13 at its lower portion.

When the swing assist member 13 comes into contact with the wafer 40, particles may be produced albeit in a small amount. To prevent this, the distal end portion of the swing assist member 13 is preferably R-processed, as shown in FIG. 8, for smooth contact with the wafer 40.

The swing assist member 13 only need to assist swing of the wafer 40 and therefore can have a shape not to impede transmission of the ultrasonic wave, e.g., a thin plate-like shape. With this arrangement, the ultrasonic wave can be uniformly supplied to the wafer 40, and the wafer 40 can be uniformly processed.

In this wafer processing apparatus 10, the wafer 40 is processed while changing the relative positional relationship between the wafer 40 and the swing assist member 13, i.e., the relative positional relationship between the wafer 40 and the wafer processing tank 11. For this reason, slight nonuniformity of the ultrasonic wave due to the swing assist member 13 poses no problem.

When the press amount of the wafer holder 21 is large to some extent, the contact pressure between the wafer 40 and the swing assist member 13 can be increased. Hence, sliding movement between the swing assist member 13 and the wafer 40 is eliminated to prevent operation failures. If the press amount is small, the gravity against the wafer 40 acts more largely on the wafer holder 21 than on the distal end portion of the swing assist member 13. When the swing assist member 13 having the shape of this embodiment is used, the press amount is preferably set to be about 30 mm after the wafer 40 comes into contact with the swing assist member 13.

Figure 7C:
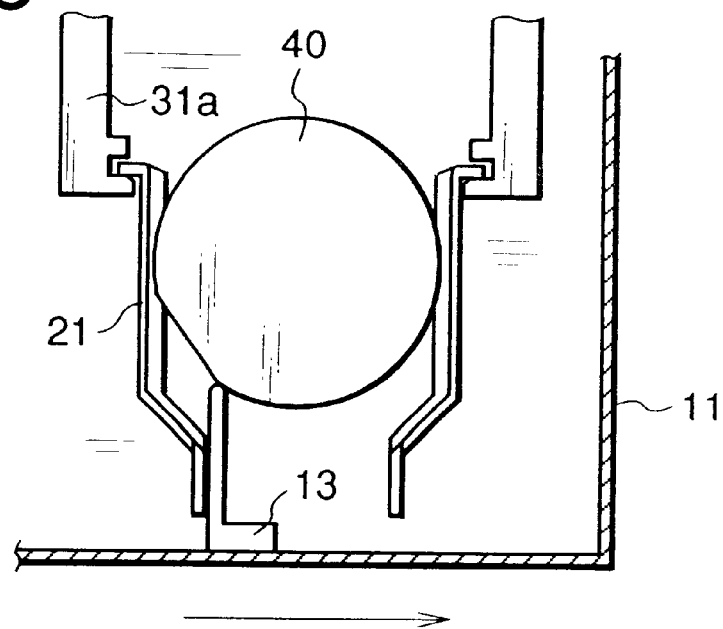
Figure 8:
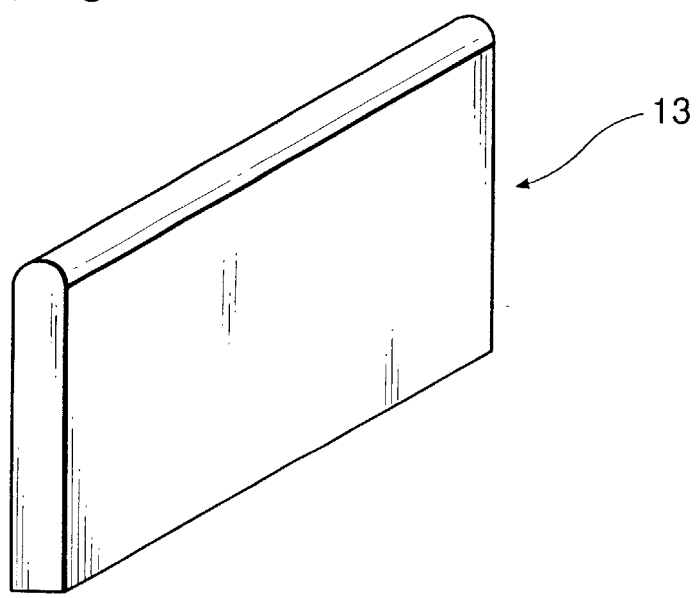
FIG. 8 is a perspective view of a swing assist member in the wafer processing apparatus shown in FIG. 6.

When the operation of pressing the wafer holder 21 is ended, the holder driving mechanism 31 moves the holding portions 31a to the right (positive X-axis direction) under computer control, as shown in FIG. 7C. The wafer 40 substantially horizontally moves to the right (positive X-axis direction) in the wafer processing tank 11 while rotating clockwise. The moving amount of the holding portions 31a must be set within the range in which the holding portions 31a do not collide against the lower opening portion of the wafer holder 21.

Figure 7D:
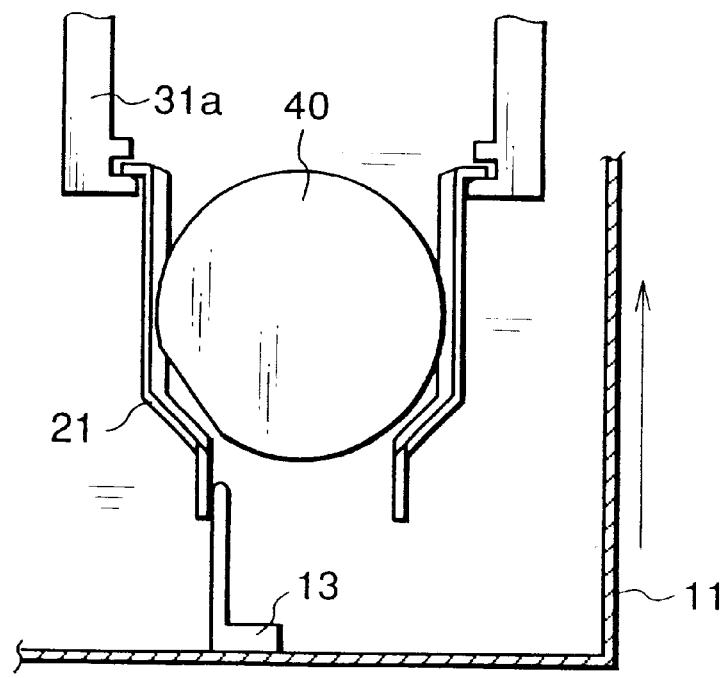

When movement of the wafer holder 21 to the right (positive X-axis direction) is ended, the holder driving mechanism 31 moves the holding portions 31a upward under computer control, as shown in FIG. 7D. The moving amount of the holding portions 31a is preferably set within the range in which the wafer 40 does not come close to a liquid surface 14 of the process solution. If the wafer 40 comes close to the liquid surface 14, particles may adhere to the surface of the wafer 40.

Figure 7E:
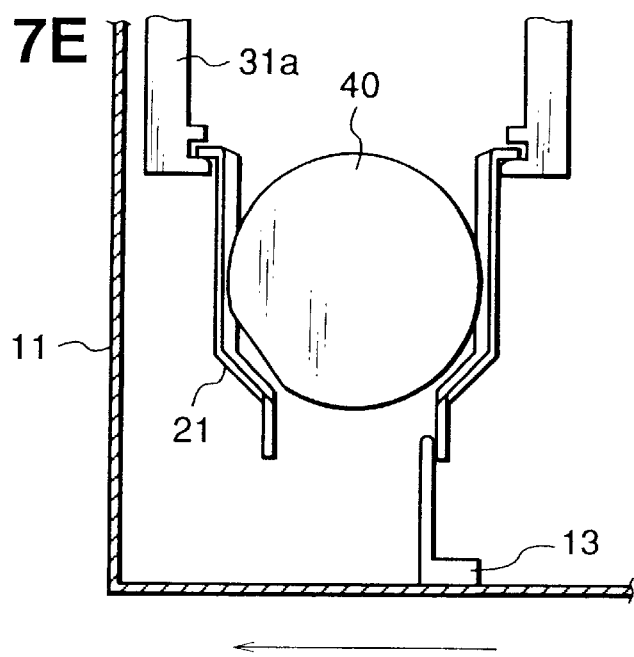

When upward movement of the wafer holder 21 is ended, the holder driving mechanism 31 moves the holding portions 31a to the left (negative X-axis direction) under computer control, as shown in FIG. 7E, so the initial state is restored (FIG. 7A).

By repeating the above operation (FIG. 7A→FIG. 7B→FIG. 7C→) FIG. 7D→FIG. 7E), the wafer 40 can be appropriately swung and uniformly processed.

According to the wafer processing apparatus 10, since the wafer 40 is swung in the region where supply of an ultrasonic wave is optimized by adjusting the ultrasonic tank 61, the ultrasonic wave acting on the wafer 40 can be optimized.

As is known, the standing wave of an ultrasonic wave has antinodes and nodes at a predetermined interval. Therefore, it is difficult to uniform the ultrasonic wave in the wafer processing tank 11.

However, in this wafer processing apparatus 10, processing for the wafer 40 can be uniformed independently of the nonuniform strength distribution of the ultrasonic wave because the holder driving mechanism 31 swings the wafer 40. Even when the wafer 40 is simply moved only in the horizontal direction, vertical direction, or oblique direction, processing for the wafer 40 can be uniformed. When the wafer 40 is also swung in the axial direction (Z-axis direction), nonuniformity in processing between wafers due to the high-strength portion of the ultrasonic wave in the horizontal plane can also be corrected.

Since the wafer processing apparatus 10 has the swing assist member 13, the swing amount of the wafer 40 can be efficiently increased. The fixed position of the swing assist member 13 is not limited to the bottom portion of the wafer processing tank 11. As far as the swing assist member 13 can contact all wafers 40 in the wafer holder 21, the swing assist member 13 may be fixed on the inner wall of the wafer processing tank 11 or on the holder driving mechanism 31 (in this case, a mechanism for changing the relative positional relationship between the holding portions 31a and the swing assist member 13 is required).

In addition, according to the wafer processing apparatus 10, since no driving mechanism is present in the wafer processing tank 11, particles are not produced due to operation of the driving mechanism.

(Fourth Arrangement of Wafer Processing Apparatus)

Figure 9:
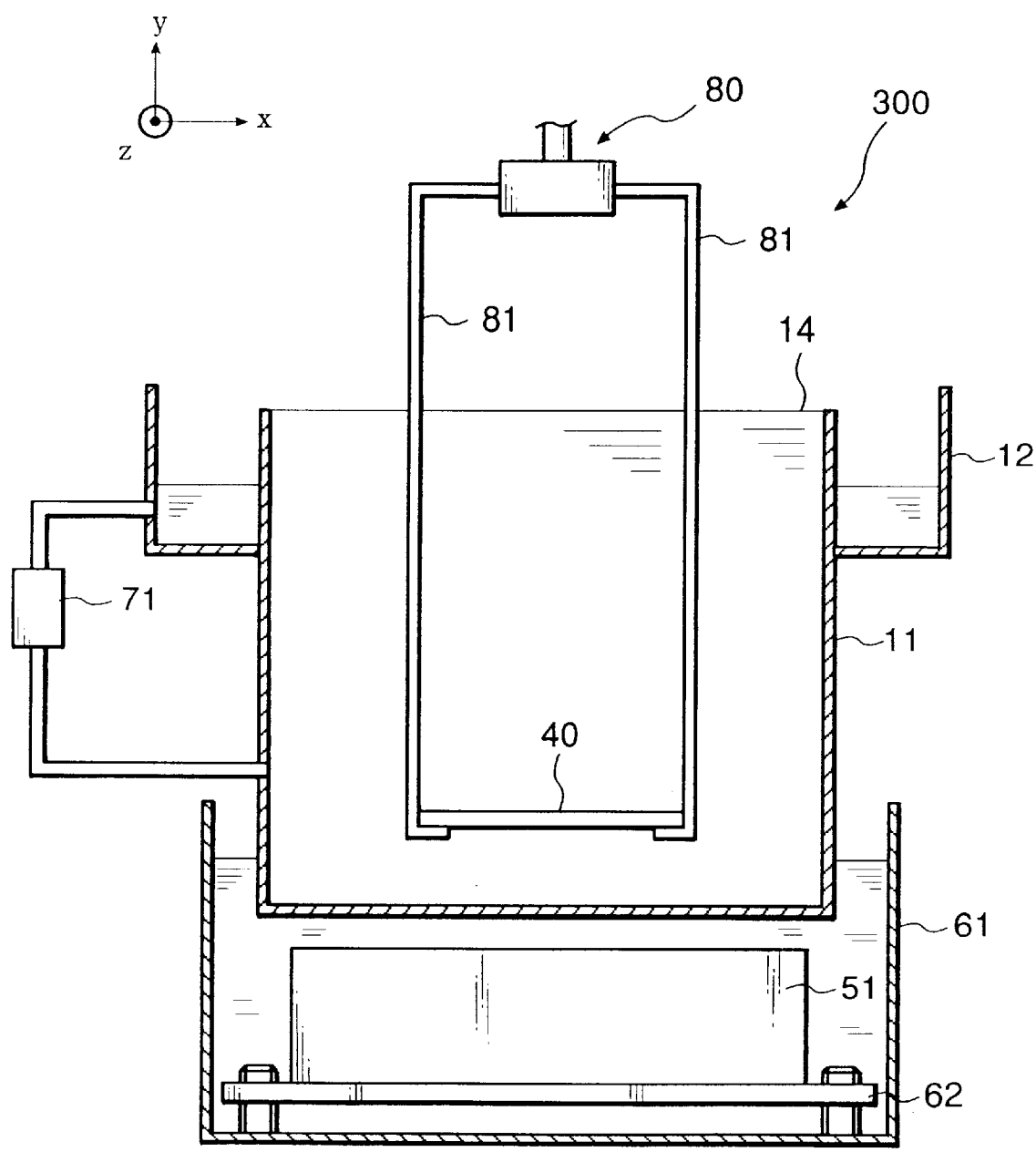
FIG. 9 is a view showing the fourth arrangement of the wafer processing apparatus.

FIG. 9 is a view showing the schematic arrangement of a wafer processing apparatus suitable to remove a porous layer.

In a wafer processing apparatus 300, the wafer 40 is held almost parallel to the bottom surface of the wafer processing tank 11 (i.e., almost parallel to the vibration plane of the ultrasonic wave) and completely dipped in the process solution (preprocess solution or etchant) in the wafer processing tank 11, and in this state, swung by a wafer moving mechanism 80, thereby uniformly processing the wafer 40 and prevent contamination by particles.

The wafer moving mechanism 80 holds the wafer 40 with an arm 81 and swings the wafer 40 in the wafer processing tank 11. The wafer 40 is preferably swung in a direction crossing the vibration plane of the ultrasonic wave (i.e., in the vertical direction) and a direction parallel to the vibration plane (i.e., in the horizontal direction).

In this wafer processing apparatus 300 as well, preferably, the wafer 40 completely dipped in the process solution is processed. In this case, particles can be prevented from adhering to the wafer 40 near the interface between the process solution and gas.

According to the wafer processing apparatus 300, the wafer 40 can be uniformly processed by swinging the wafer 40 in the wafer processing tank 11.

(Fifth Arrangement of Wafer Processing Apparatus)

Figure 10:
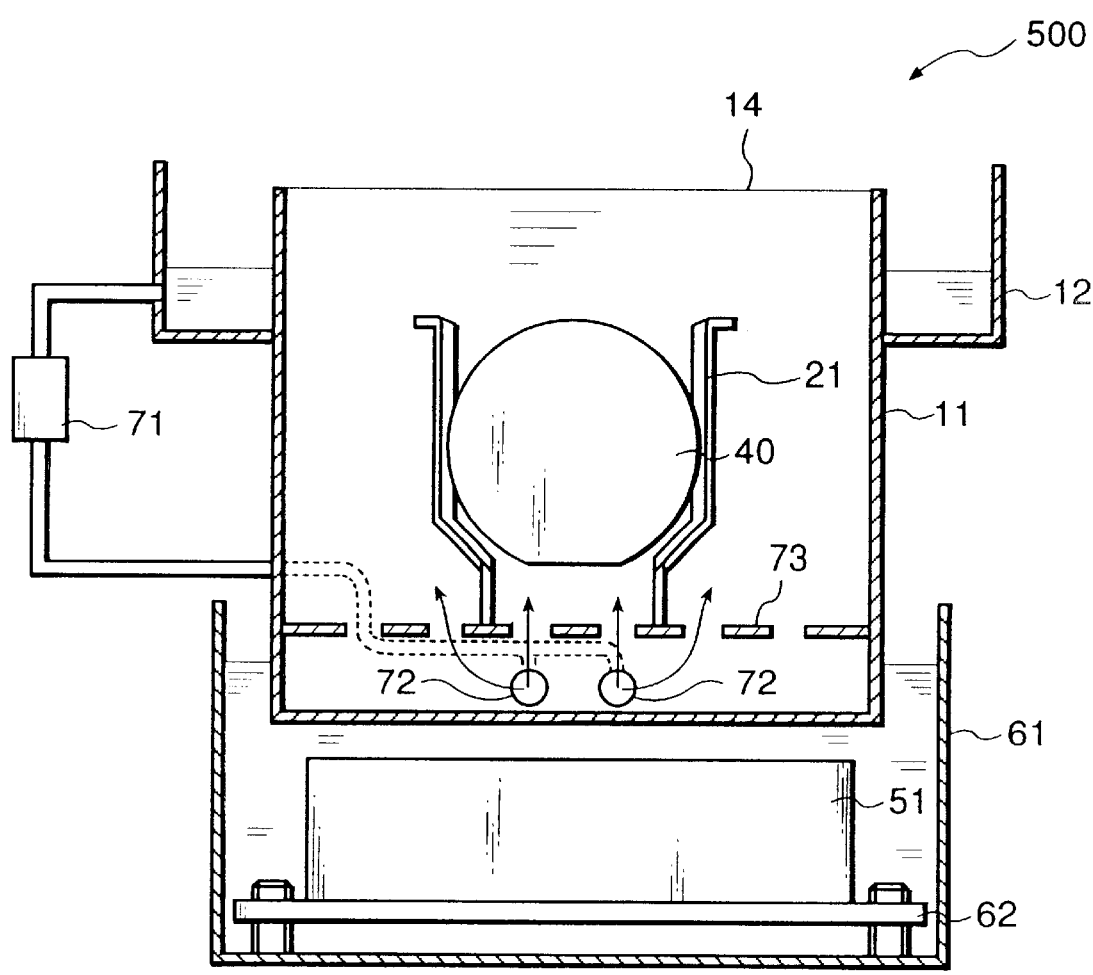
FIG. 10 is a view showing the fifth arrangement of the wafer processing apparatus.

FIG. 10 is a view showing the schematic arrangement of a wafer processing apparatus suitable to remove a porous layer. In the wafer processing apparatuses of the second to fourth arrangements, wafers are processed while being swung. In a wafer processing apparatus 500 of the fifth arrangement, the speed of flow of the process solution (preprocess solution or etchant) is increased instead of swinging wafers.

In the wafer processing apparatus 500, a support portion 73 for supporting the wafer holder 21 is placed at the lower portion of the wafer processing tank 11. The process solution supplied from the circulator 71 spouts from spout ports 72 under the support portion 73 at a high speed. The support portion 73 has a plurality of opening portions. The process solution spouted from the spout ports 72 moves upward through the opening portions.

When the process solution is circulated at a high speed, the wafer 40 can be uniformly processed.

It is also effective to assemble the above-described circulating mechanism (71 to 73) in the wafer processing apparatus 10 shown in FIG. 5.

(Sixth Arrangement of Wafer Processing Apparatus)

In the above-described wafer processing apparatuses, supply and nonsupply of the ultrasonic wave to the wafer processing tank are switched by controlling the ultrasonic source. Instead, a mechanism for shielding the ultrasonic wave as needed may be inserted between the ultrasonic source and the wafer.

Figure 11A:
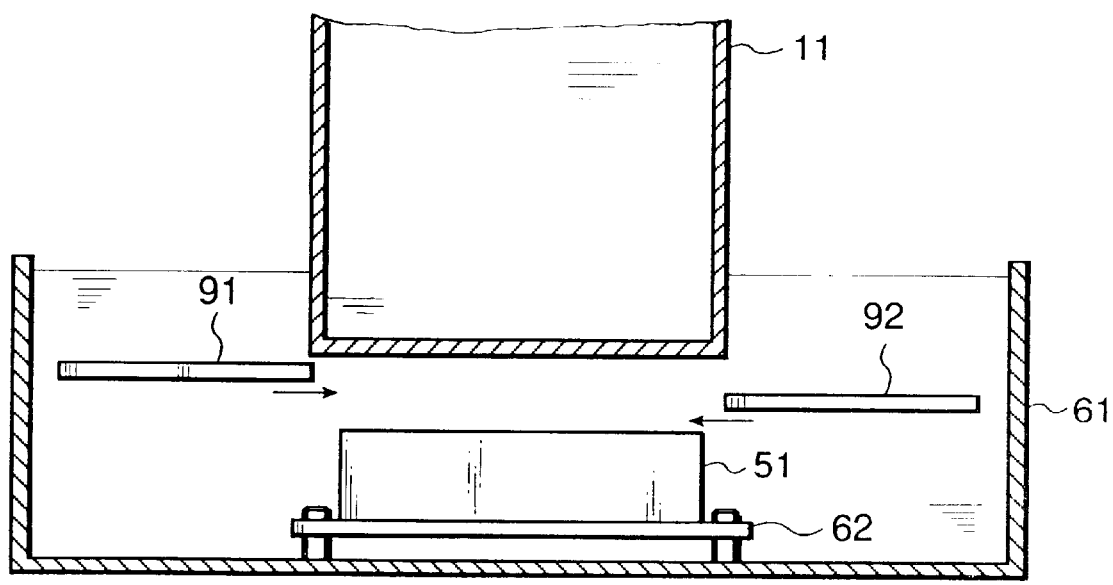
FIGS. 11A and 11B are views showing a modification of the wafer processing apparatus shown in FIG. 5 or 6.
Figure 11B:
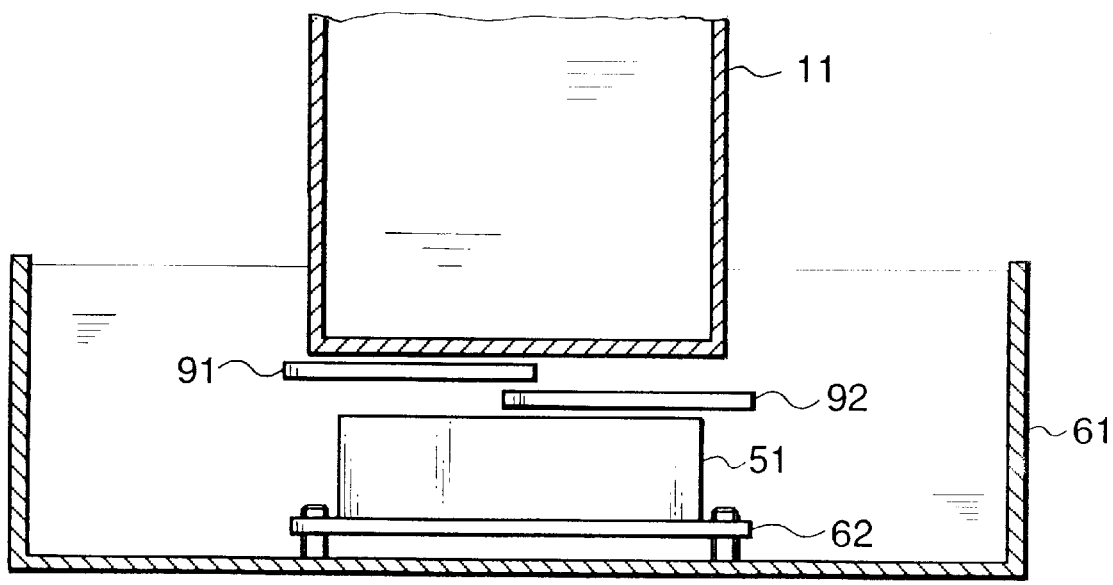

A modification of the wafer processing apparatus shown in FIGS. 5 or 6 will be described. FIGS. 11A and 11B show a modification of the wafer processing apparatus shown in FIGS. 5 or 6. In FIGS. 11A and 11B, the overflow tank and the circulator are omitted.

The wafer processing apparatus of this modification has shutters 91 and 92 for shielding the ultrasonic wave, as needed, between the ultrasonic source 51 and the bottom surface of the wafer processing tank 11. To transmit the ultrasonic wave to the wafer processing tank 11, the shutters 91 and 92 are opened by a driving section (not shown), as shown in FIG. 11A. To shield the ultrasonic wave to the wafer processing tank 11, the shutters 91 and 92 are closed by the driving section (not shown), as shown in FIG. 11B. As the material of the shutters 91 and 92, a material which hardly transmits the ultrasonic wave, e.g., PFA or PTFE is suitable.

(Seventh Arrangement of Wafer Processing Apparatus)

Figure 12A:
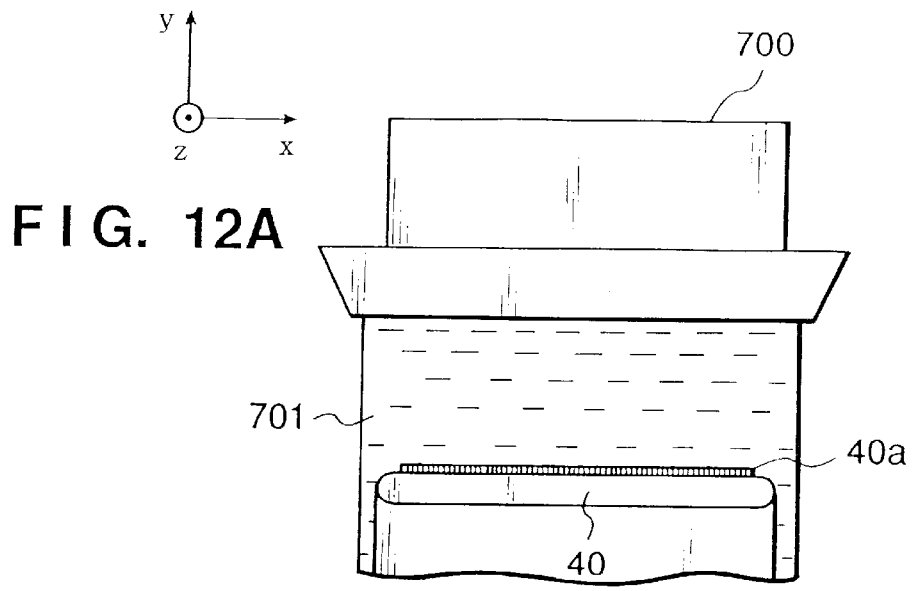
FIGS. 12A to 12C are views showing the seventh arrangement of the wafer processing apparatus.
Figure 12B:
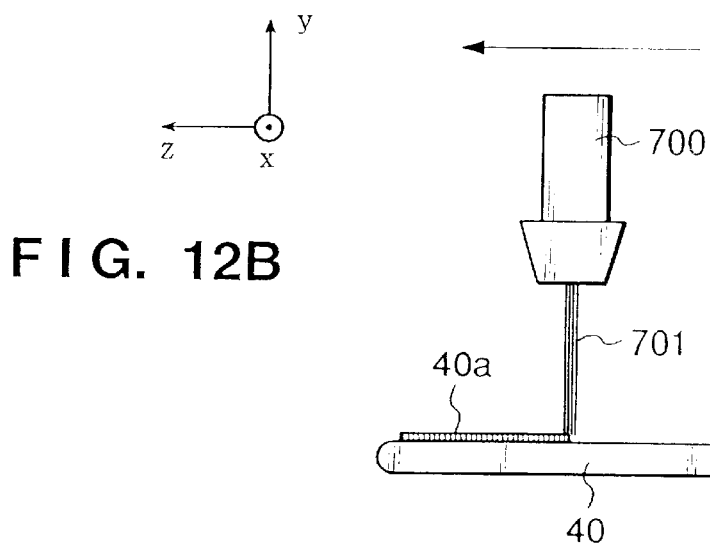
Figure 12C:
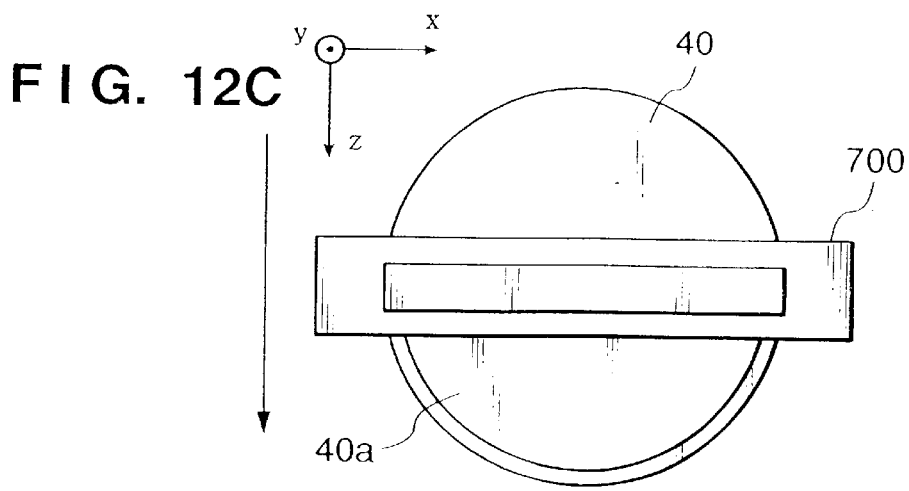

FIGS. 12A to 12C are views showing the schematic arrangement of a wafer processing apparatus suitable to remove a porous layer. FIG. 12A is a front view, FIG. 12B is a side view, and FIG. 1C is a plan view.

In a wafer processing apparatus 700, a jet of fluid (e.g., water) 701 is sprayed from the spray nozzle 700, and the porous layer of the wafer 40 is removed by the sprayed fluid.

In the example shown in FIGS. 12A to 12C, the spray nozzle 700 is scanned in the Z-axis direction while spraying the fluid 701 from the spray nozzle 700 perpendicularly to the wafer 40, thereby removing a porous layer 40 a on the entire surface.

(Eighth Arrangement of Wafer Processing Apparatus)

FIG. 13 is a view showing the schematic arrangement of a wafer processing apparatus suitable to remove a porous layer. This wafer processing apparatus comprises a wafer processing apparatus 100a for preprocess, a wafer processing apparatus 100b for main process, and a conveyance mechanism 800 for conveying a substrate to be processed. For example, the wafer processing apparatus 100 shown in FIG. 4 can be applied to the wafer processing apparatus 100a for preprocess and the wafer processing apparatus 100b for main process.

The conveyance mechanism 800 has a conveyor robot 802 horizontally movable along a horizontal shaft 804 and vertically movable along a vertical shaft 803. The conveyor robot 802 has a plurality of substrate holding mechanisms 801 each having a chuck portion for chucking and holding the lower surface of a substrate to be processed.

In this wafer processing apparatus, first a substrate to be processed (a substrate having a porous layer on the surface) is conveyed to the wafer processing apparatus 100a for preprocess by the conveyance mechanism 800 and set in the wafer processing tank. The preprocess is executed in the wafer processing apparatus 100a.

The preprocessed substrate is conveyed to the wafer processing apparatus 100b for main process by the conveyance mechanism 800 and set in the wafer processing tank. The main process is executed in the wafer processing apparatus 100b.

The substrate which has undergone the main process is extracted from the wafer processing apparatus 100b by the conveyance mechanism 800 and stored in, e.g., a wafer cassette.

According to this wafer processing apparatus, porous layer removing processing including the preprocess and main process can be automatically executed.

Examples to which the above porous layer removing method will be described below.

Example 1

A film of a material having a HF resistance was formed on the surface of a single-crystal Si substrate and patterned to form a mask pattern having an opening. The single-crystal Si substrate exposed in the opening portion was anodized in an HF solution to form a porous layer. With this process, a 50 $\mu$m thick porous layer was formed on the single-crystal Si substrate. Subsequently, the mask pattern was removed. Instead of forming a mask pattern on the single-crystal Si substrate, the single-crystal Si substrate may be set in a holder with which the HF solution can contact only a region where the porous layer is to be formed, and subjected to anodizing.

The resultant substrate was set in the wafer processing apparatus 100 for preprocess shown in FIG. 4. The wafer processing tank 110 of the wafer processing apparatus 100 for preprocess was filled with a solution (preprocess solution) containing an alcohol in advance. In the wafer processing apparatus 100 for preprocess, the substrate was rotated for about 2 hrs, and at the same time, an ultrasonic wave near 1 MHz was applied to fill pores in the porous Si layer with the solution containing alcohol (preprocess).

The preprocessed substrate was set in the processing apparatus 100 for main process shown in FIG. 4. The wafer processing tank 110 of the processing apparatus 100 for main process was filled with a mixed solution (etchant) of hydrofluoric acid, hydrogen peroxide, and pure water in advance. In the-processing apparatus 100 for main process, the substrate was rotated for about 0.5 hrs, and at the same time, an ultrasonic wave near 0.25 MHz was applied to fill pores in the porous Si layer with the etchant.

The operation of the ultrasonic source 131 was stopped, and the substrate was left to stand in the wafer processing tank 110 for about 1 hr. With this process, the pore walls of the porous Si layer thinned.

Subsequently, the porous Si layer was completely removed using the apparatus shown in FIGS. 12A to 12C. As a result, a structure having a 50 $\mu$m deep recessed portion on the substrate surface was formed. The porous Si layer could be completely removed even when the operation of the ultrasonic source 131 was stopped, and then, the substrate was left to stand in the wafer processing tank 110 for about 2 hrs, instead of using the apparatus shown in FIGS. 12A to 12C.

The same structure as described above could be formed using the apparatus shown in FIGS. 5, 6, or 9.

Example 2

A film of a material having a HF resistance was formed on the surface of a single-crystal Si substrate and patterned to form a mask pattern having an opening. The single-crystal Si substrate exposed in the opening portion was anodized in an HF solution to form a porous layer reaching the lower surface. Then, the mask pattern was removed. Instead of forming a mask pattern on the single-crystal Si substrate, the single-crystal Si substrate may be set in a holder with which the HF solution can contact only the region where the porous layer is to be formed, and subjected to anodizing.

Subsequently, a single-crystal Si layer having a thickness of 1 µm was formed on the surface of the substrate as a resultant structure by epitaxial growth.

The resultant substrate was set in the wafer processing apparatus 100 for preprocess shown in FIG. 4. The wafer processing tank 110 of the wafer processing apparatus 100 for preprocess was filled with a solution (preprocess solution) containing hydrogen peroxide in advance. In the wafer processing apparatus 100 for preprocess, the substrate was rotated for about 6 hrs, and at the same time, an ultrasonic wave near 0.25 MHz was applied to fill pores in the porous Si layer with the preprocess solution (preprocess).

The preprocessed substrate was set in the processing apparatus 100 for main process shown in FIG. 4. The wafer processing tank 110 of the processing apparatus 100 for main process was filled with a mixed solution (etchant) of hydrofluoric acid, hydrogen peroxide, and pure water in advance. In the processing apparatus 100 for main process, the substrate was rotated for about 2 hrs, and at the same time, an ultrasonic wave near 0.25 MHz was applied to fill pores in the porous Si layer with the etchant.

Application of the ultrasonic wave was stopped, and the substrate was left to stand in the wafer processing tank 110 for about 2 hrs. With this process, the pore walls of the porous Si layer thinned.

The ultrasonic source 131 was operated again for about 5 min to completely remove the porous Si layer. The porous Si layer could be completely removed even when the operation of the ultrasonic source 131 was stopped, and then, the substrate was left to stand in the wafer processing tank 110 for about 4 hrs, instead of operating the ultrasonic source 131 again.

With the above process, a single-crystal Si membrane including the epitaxial layer (single-crystal Si layer) formed on the porous Si layer was formed. The epitaxial layer had an almost uniform thickness on the entire surface.

A cantilever structure of single-crystal Si may be formed, as shown in FIG. 2C, by partially removing the epitaxial layer (single-crystal Si layer) in advance.

The same result as described above could be obtained by the apparatus shown in FIGS. 5, 6, or 9.

Example 3

A first single-crystal Si substrate was prepared. The surface layer was anodized in a HF solution to form a porous Si layer. The anodizing conditions were as follows.

Current density: 7 (mA/cm$^2$)
Anodizing solution: HF:H$_2$O:C$_2$H$_5$OH=1:1:1
Time: 11 (min)
Thickness of porous Si layer: 12 (µm)

This substrate was then oxidized in an oxygen atmosphere at 400° C. for 1 hr. Upon this oxidation, the inner wall of each pore of the porous Si layer was covered with a thermal oxide film. A single-crystal Si layer having a thickness of 0.30 µm was epitaxially grown on the porous Si layer by CVD (Chemical Vapor Deposition). The growing conditions are as follows.

| | |
|---|---|
| Source gas: | SiH$_2$Cl$_2$/H$_2$ |
| Gas flow rate: | 0.5/180 (l/min) |
| Gas pressure: | 80 (Torr) |
| Temperature: | 950 (° C.) |
| Growth rate: | 0.3 (µm/min) |

Subsequently, an SiO$_2$ layer having a thickness of 200 nm was formed on the epitaxial Si layer by thermal oxidation.

The surface of the SiO$_2$ layer of the first substrate was bonded to the surface of a separately prepared Si substrate (second substrate).

The first substrate side was removed by grinding, polishing, or etching to expose the porous Si layer in the entire region on the second substrate.

The second substrate was set in the wafer processing apparatus 100 for preprocess shown in FIG. 4. The wafer processing tank 110 of the wafer processing apparatus 100 for preprocess was filled with a solution (preprocess solution) containing hydrogen peroxide in advance. In the wafer processing apparatus 100 for preprocess, the substrate was rotated for 2 hrs, and at the same time, an ultrasonic wave near 0.25 MHz was applied to fill pores in the porous Si layer with the preprocess solution (preprocess).

The preprocessed substrate was set in the wafer processing apparatus 100 for main process shown in FIG. 4. The wafer processing tank 110 of the processing apparatus 100 for main process was filled with a mixed solution (etchant) of fluoric acid, hydrogen peroxide, and pure water in advance. In the processing apparatus 100 for main process, the substrate was rotated for about 0.5 hrs, and at the same time, an ultrasonic wave near 0.25 MHz was applied to fill pores in the porous Si layer with the etchant.

The operation of the ultrasonic source 131 was stopped, and the substrate was left to stand in the wafer processing tank 110 for about 1 hr. With this process, the pore walls of the porous Si layer thinned.

The ultrasonic source 131 was operated again for about 5 min to completely remove the porous Si layer. At this time, when the etchant is appropriately circulated, as shown in FIG. 10, surface uniformity of the processed substrate increases.

One wafer processing apparatus may be used for both the preprocess and the main process. In this case, the etchant can be prepared by adding hydrofluoric acid to the preprocess solution containing hydrogen peroxide.

When pores in the porous Si layer are filled with the preprocess solution such as a solution containing hydrogen peroxide to oxide the pore walls prior to the main process (etching), the pores in the porous Si layer can be easily filled with the etchant containing hydroluoric acid. The preprocess solution may be a solution having no oxidation function.

The etchant filling time is shortened even by applying an ultrasonic wave, rotating the substrate, or circulating the process solution.

As described above, after the pores in the porous Si layer are filled with the preprocess solution, an ultrasonic wave is applied to the etchant while circulating the etchant, and also, the preprocess solution is replaced with the etchant while rotating the substrate. With this operation, pores in the porous layer of the substrate can be quickly filled with the etchant. Subsequently, application of the ultrasonic wave is stopped, and the substrate is left to stand for an appropriate time. With this process, for each of all substrates, the pore walls in the porous Si layer can be sufficiently thinned in the entire region on the surface. By applying the ultrasonic wave again in this state, the remaining porous Si layer can be removed at once uniformly on the entire region of each substrate.

The same result as described above could be obtained by the apparatus shown in FIGS. 5, 6, or 9.

Even when one of the following methods is employed instead of the method of applying an ultrasonic wave again after application of the ultrasonic wave is stopped, the remaining porous Si layer can be removed with high quality.

(1) The resultant structure is dipped in a mixed solution of hydrofluoric acid, hydrogen peroxide, and pure water for about 5 sec to remove the porous layer.
(2) The porous Si layer is removed by polishing.
(3) The porous Si layer is removed by scrubbing.
(4) The porous Si layer is removed by scanning the substrate while spraying a water jet at a pressure of, e.g., 1,000 kg/cm$^2$.

In the step of removing the porous Si layer, the single-crystal Si layer functioned as an etch stop layer, so the porous Si layer was selectively etched and completely removed.

The etching rate of the non-porous Si single crystal for the above etchant is very low. The selectivity ratio of the etching rate of the non-porous Si single crystal to that of the porous layer is 10$^5$ or more. The etching amount of the non-porous layer (about several ten Å) is allowable for practical use.

With the above process, an SOI substrate having a 0.2 -$\mu$m thick single-crystal Si layer on the Si oxide film was formed. The thickness of the resultant single-crystal Si layer was measured at 100 points on the entire surface. The thickness was 201 nm±4 nm.

The resultant structure was subjected to a heat treatment in hydrogen at 1,100° C. for 1 hr, and the surface roughness was evaluated with an atomic force microscope. The mean square roughness in a 5 -$\mu$m square area was about 0.2 nm. This nearly equals that of a commercially available Si wafer.

Section observation with a transmission electron microscope revealed that no new crystal defects were formed in the single-crystal Si layer, and satisfactory crystallinity was maintained.

The same result as described above was obtained even when the oxide film (SiO$_2$) was formed not on the surface of the epitaxial layer but on the surface of the second substrate or on both these surfaces.

A satisfactory result was obtained even when a transparent substrate of silica glass or the like was used as the second substrate. In this case, however, since a slip may be formed in the single-crystal Si layer due to some difference in thermal expansion coefficient between silica glass and the single-crystal Si layer, the temperature of the heat treatment in hydrogen was decreased from 1,100° C. to 1,000° C. or less.

Example 4

A second substrate was subjected to two-step anodizing in an HF solution to form two porous layers. The anodizing conditions were as follows.

<Anodizing of First Step>
Current density: 7 (mA/cm$^2$)
Anodizing solution: HF:H$_2$O:C$_2$H$_5$OH=1:1:1
Time: 5 (min)
Thickness of porous Si layer: 5.5 ($\mu$m)

<Anodizing of Second Step>
Current density: 30 (mA/cm$^2$)
Anodizing solution: HF:H$_2$O:C$_2$H$_5$OH=1:1:1
Time: 110 (sec)
Thickness of porous Si layer: 3 ($\mu$m)

Subsequently, this substrate was oxidized in an oxygen atmosphere at 400° C. for 1 hr. Upon this oxidation, the inner wall of each pore of the porous Si layer was covered with a thermal oxide film. A single-crystal Si layer having a thickness of 0.15 $\mu$m was epitaxially grown on the porous Si layer by CVD (Chemical Vapor Deposition). The growing conditions were as follows.

| Source gas: | SiH$_2$Cl$_2$/H$_2$ |
|---|---|
| Gas flow rate: | 0.5/180 (l/min) |
| Gas pressure: | 80 (Torr) |
| Temperature: | 950 (° C.) |
| Growth rate: | 0.3 ($\mu$m/min) |

After that, an SiO$_2$ layer having a thickness of 100 nm was formed on the epitaxial Si layer by thermal oxidation.

The surface of the SiO$_2$ layer of the first substrate was bonded to the surface of a separately prepared Si substrate (second substrate).

The bonded substrate stack was divided into two substrates by the porous Si layer formed at a current density of 30 mA/cm$^2$ (anodizing of second step) to expose the porous Si layer on the entire surface on the second substrate side. To divide the bonded substrate stack, the substrates are mechanically pulled, twisted, or pressed, a wedge is driven into the bonded substrate stack, the bonded substrate stack is oxidized from the end face to peel the substrates, thermal stress is used, an ultrasonic wave is applied, or a water jet is injected into the bonded substrate stack.

The resultant substrate structure was set in the wafer processing apparatus 100 for preprocess shown in FIG. 4. The wafer processing tank 110 of the wafer processing apparatus 100 for preprocess was filled with a solution (preprocess solution) containing hydrogen peroxide in advance. In the wafer processing apparatus 100 for preprocess, the substrate was rotated for approximately 2 hrs, and at the same time, an ultrasonic wave near 0.25 MHz was applied to fill pores in the porous Si layer with the preprocess solution (preprocess).

The preprocessed substrate was set in the wafer processing apparatus 100 for main process shown in FIG. 4. The wafer processing tank 110 of the wafer processing apparatus 100 for main process was filled with a mixed solution (etchant) of hydrofluoric acid, hydrogen peroxide, and pure water in advance. In the processing apparatus 100 for main process, the substrate was rotated for about 0.5 hrs, and at the same time, an ultrasonic wave near 0.25 MHz was applied to fill pores in the porous Si layer with the etchant.

Application of the ultrasonic wave was stopped, and the substrate was left to stand in the wafer processing tank 110 for about 1 hr. With this process, the pore walls of the porous Si layer thinned.

The ultrasonic source 131 was operated again for about 5 min to completely remove the porous Si layer. At this time, when the etchant is appropriately circulated, as shown in FIG. 10, surface uniformity of the processed substrate improves.

One wafer processing apparatus may be used for both the preprocess and the main process. In this case, the etchant can be prepared by adding hydrofluoric acid to the preprocess solution containing hydrogen peroxide.

When pores in the porous Si layer are filled with the preprocess solution such as a solution containing hydrogen peroxide to oxidize the pore walls prior to the main process (etching), the pores in the porous Si layer can be easily filled with the etchant containing fluoric acid. The preprocess solution may be a solution having no oxidation function.

The etchant filling time is shortened even by applying an ultrasonic wave, rotating the substrate, or circulating the process solution.

As described above, after the pores in the porous Si layer are filled with the preprocess solution, an ultrasonic wave is applied to the etchant while circulating the etchant, and also, the preprocess solution is replaced with the etchant while rotating the substrate. With this operation, pores in the porous layer of the substrate can be quickly filled with the etchant. Subsequently, application of the ultrasonic wave is stopped, and the substrate is left to stand for an appropriate time. With this process, for each of all substrates, the pore walls in the porous Si layer can be sufficiently thinned in the entire region on the surface. By applying the ultrasonic wave again in this state, the remaining porous Si layer can be removed at once uniformly on the entire region of each substrate.

The same result as described above could be obtained by the apparatus shown in FIGS. 5, 6, or 9.

Even when one of the following methods is employed instead of the method of applying an ultrasonic wave after application of the ultrasonic wave is stopped, the remaining porous Si layer can be removed with high quality.

(1) The resultant structure is dipped in a mixed solution of hydrofluoric acid, hydrogen peroxide, and pure water for about 5 sec to remove the porous layer.
(2) The porous Si layer is removed by polishing.
(3) The porous Si layer is removed by scrubbing.
(4) The porous Si layer is removed by scanning the substrate while spraying a water jet at a pressure of, e.g., 1,000 kg/cm$^2$.

In the step of removing the porous Si layer, the single-crystal Si layer functioned as an etch stop layer, so the porous Si layer was selectively etched and completely removed.

The etching rate of the non-porous Si single crystal for the above etchant is very low. The selectivity ratio of the etching rate of the non-porous Si single crystal to that of the porous layer is $10^5$ or more. The etching amount of the non-porous layer (about several ten Å) is allowable for practical use.

With the above process, an SOI substrate having a 0.2 -μm thick single-crystal Si layer on the Si oxide film was formed. The thickness of the resultant single-crystal Si layer was measured at 100 points on the entire surface. The thickness was 101 nm±3 nm.

The resultant structure was subjected to a heat treatment in hydrogen at 1,100° C. for 1 hr, and the surface roughness was evaluated with an atomic force microscope. The mean square roughness in a 5 -μm square area was about 0.2 nm. This nearly equals that of a commercially available Si wafer.

Section observation with a transmission electron microscope revealed that no new crystal defects were formed in the single-crystal Si layer, and satisfactory crystallinity was maintained.

The same result as described above was obtained even when the oxide film was formed not on the surface of the epitaxial layer but on the surface of the second substrate or on both these surfaces.

A satisfactory result was obtained even when a transparent substrate of silica glass or the like was used as the second substrate. However, since a slip may be formed in the single-crystal Si layer due to some difference in thermal expansion coefficient between silica glass and the Si layer, the temperature of the heat treatment in hydrogen was decreased from 1,100° C. to 1,000° C. or less.

When the porous Si layer left on the first substrate side was selectively etched and subjected to a surface treatment such as hydrogen annealing or surface polishing, the substrate could be recycled as the first or second substrate.

Almost the same result as described above was obtained even when a porous layer with a single-layered structure was formed by anodizing.

In the above examples, as the epitaxial growing method of forming a single-crystal Si layer on the porous Si layer, not only CVD but also MBE, sputtering, or liquid phase growing can be used. A single-crystal compound semiconductor layer of GaAs or InP may be epitaxially grown on the porous Si layer. In this case, a high-frequency device such as GaAs on Si or GaAs on Glass (Quartz) or a substrate suitable for OEIC can be manufactured.

As the etchant used to selectively etch the porous Si layer, a mixed solution of 49% hydrofluoric acid and 30% hydrogen peroxide is suitable. However, the following etchants can also be used. Since the porous Si layer has a large surface area, selective etching is easy.

(a) Hydrofluoric acid
(b) Mixed solution prepared by adding at least one of an alcohol and hydrogen peroxide to hydrofluoric acid
(c) Buffered hydrofluoric acid
(d) Mixed solution prepared by adding at least one of an alcohol and hydrogen peroxide to buffered hydrofluoric acid
(e) Mixed solution of hydrofluoric acid and nitric acid
(f) Mixed solution of hydrofluoric acid, nitric acid, and acetic acid.

In the above examples, to stop application of the ultrasonic wave, the operation of the ultrasonic source is stopped. However, use of shutters is also effective, as shown in FIGS. 11A and 11B.

As the porous layer, not only a porous Si layer but also a porous layer formed from another semiconductor material such as GaAs or SiC, an $Al_2O_3$ anodized in oxalic acid, or an ultrafine particle film generated by CVD is suitable. These layers can be easily removed by etching.

According to the above embodiment, by shortening the etchant filling time for the porous layer, variations in progress in etching in the substrate surface or between substrates can be suppressed, and given film thickness uniformity of the underlying surface layer can be maintained. In addition, even when the thickness of a porous layer varies, given film thickness uniformity of the underlying surface layer can be maintained.

According to the present invention, a high planarity of the underlying layer of the porous region can be maintained.

The present invention is not limited to the above embodiments and various changes and modifications can be made within the spirit and scope of the present invention. Therefore, to apprise the public of the scope of the present invention, the following claims are made.

What is claimed is:

1. A porous region removing method for removing a porous region from a substrate having the porous region, comprising:

the first step of filling the porous region with a first process solution having no etching function or weak etching function for a porous material; and the second step of replacing the first process solution filling the porous region with a second process solution, under the condition that the porous region is filled with the first process solution, and etching the porous region using the second process solution, the second process solution having an etching function for a porous material stronger than that of the first process solution.

2. The method according to claim 1, wherein said second step comprises replacing the first process solution filling the porous region with the second process solution to etch the porous region.

3. The method according to claim 1, wherein said substrate to be processed essentially consists of single-crystal Si.

4. The method according to claim 1, wherein said porous region essentially consists of an Si material.

5. The method according to claim 1, wherein said porous region is formed by anodizing a substrate consisting of single-crystal Si.

6. The method according to claim 1, wherein said first process solution chemically changes pore walls in the porous region, and said second process solution has the etching function not only for a porous material but also for a substance which chemically changes.

7. The method according to claim 6, wherein said first process solution has an oxidation function for the pore walls in the porous region.

8. The method according to claim 1, wherein said first process solution is water.

9. The method according to claims 3, wherein the first process solution contains a material selected from the group consisting of an alcohol, hydrogen peroxide, nitric acid, and hydrochloric acid.

10. The method according to claim 5, wherein the second process solution contains hydrofluoric acid.

11. The method according to claim 5, wherein the second process solution is a material selected from the group consisting of
  (a) a mixed solution prepared by adding at least one of an alcohol and hydrogen peroxide to hydrofluoric acid,
  (b) a mixed solution of hydrofluoric acid and nitric acid, and
  (c) a mixed solution of hydrofluoric acid, nitric acid, and acetic acid.

12. The method according to claim 1, wherein an ultrasonic wave is supplied to the substrate during at least part of an overall period of execution of the first and second steps.

13. The method according to claim 1, wherein said first step comprises supplying an ultrasonic wave to the substrate.

14. The method according to claim 1, wherein an ultrasonic wave is supplied to the substrate during at least part of an overall period of execution of the second step.

15. The method according to claim 1, wherein an ultrasonic wave is supplied to the substrate during at least part of an overall period of execution of the second step, in which the first process solution filling the porous region is replaced with the second process solution.

16. The method according to claim 1, wherein said second step comprises the steps of:
  etching the porous region without supplying any ultrasonic wave to the substrate until the pore walls in the porous region have not more than a first thickness; and
  etching the porous region remaining on the substrate while supplying an ultrasonic wave to the substrate, thereby removing the porous region.

17. The method according to claim 1, wherein said second step comprises the steps of:
  replacing the first process solution filling the porous region with the second process solution while supplying an ultrasonic wave to the substrate;
  etching the porous region without supplying any ultrasonic wave to the substrate until the pore walls in the porous region have not more than a first thickness; and
  etching the porous region remaining on the substrate while supplying an ultrasonic wave to the substrate, thereby removing the porous region.

18. The method according to claim 17, wherein, in processing the substrate while supplying the ultrasonic wave to the substrate, the substrate is swung in the process solution.

19. The method according to claim 17, wherein, in processing the substrate while supplying the ultrasonic wave to the substrate, a position of at least one of the substrate and the ultrasonic source is changed in a direction substantially parallel or perpendicular to a vibration plane of the ultrasonic wave.

20. The method according to claim 1, wherein said first step comprises circulating the process solution to form a flow of the process solution near the substrate.

21. The method according to claim 12, wherein supply of the ultrasonic wave to the substrate is controlled by inserting an ultrasonic wave shielding plate between the ultrasonic source and the substrate.

22. A method of manufacturing a semiconductor substrate, comprising the steps of:
  forming a porous layer and at least one non-porous layer on a first substrate;
  bonding a second substrate to the non-porous layer side of the first substrate;
  removing the first substrate from the bonded substrate stack to expose the porous layer on a surface of the second substrate; and
  removing the porous layer on the second substrate using the porous region removing method of claim 1.

23. The method according to claim 22, wherein the step of exposing the porous layer comprises grinding, polishing, or etching the first substrate from a lower surface side of the bonded first substrate to expose the porous layer on the surface of the second substrate.

24. The method according to claim 22, wherein the step of exposing the porous layer comprises dividing the bonded substrate stack at the porous layer to expose the porous layer on the surface of the second substrate.

25. The method according to claim 22, wherein said non-porous layer includes a single-crystal Si layer.

26. The method according to claim 22 wherein said non-porous layer includes a single-crystal Si layer and an Si oxide layer.

27. The method according to claim 25, wherein said single-crystal Si layer is a layer epitaxially grown on the porous layer of the first substrate.

28. The method according to claim 22, wherein said non-porous layer includes a single-crystal compound semiconductor layer.

29. The method according to claim 22, wherein said second substrate essentially consists of an Si material.

30. The method according to claim 22, wherein said second substrate has an Si oxide layer on a surface to be bonded to the first substrate.

31. The method according to claim 22, wherein said second substrate is a transparent substrate.

32. A porous region removing apparatus for removing a porous region from a substrate having the porous region, comprising:
  means for executing the first step of filling the porous region with a first process solution having no etching function or weak etching function for a porous material; and
  means for executing the second step of replacing the first process solution filling the porous region with the second process solution having an etching function for a porous material to etch the porous region.

33. The method according to claim 1, wherein said second step comprises circulating the process solution to form a flow of the process solution near the substrate.

* * * * *

UNITED STATES PATENT AND TRADEMARK OFFICE
CERTIFICATE OF CORRECTION

PATENT NO. : 6,380,099 B2
DATED : April 30, 2002
INVENTOR(S) : Kiyofumi Sakaguchi et al.

It is certified that error appears in the above-identified patent and that said Letters Patent is hereby corrected as shown below:

Title page,
Item [57], ABSTRACT,
Line 5, please delete "fluoric" and insert therefor -- Hydrofluoric --

Column 7,
Line 39, please delete "fluoric", and insert therefor -- Hydrofluoric --

Column 20,
Lines 46-50, please delete "hydrogen peroxide, and pure water in advance. In the processing apparatus 100 for main process, the substrate was rotated for about 0.5 hrs, and at the same time, an ultrasonic wave near 0.25 MHz was applied to fill pores in the porous $S_i$ layer with the etchant."

Column 22,
Lines 64-67, please cancel claim 2

Column 23,
Line 64, please delete "claim 17" and insert therefor -- claim 33 --

Column 24,
Line 1, please delete "claim 17" and insert therefor -- claim 33 --
Lines 7-9, claim 20 should read
-- The method according to claim 1, wherein said first and/or second steps comprises circulating the process solution to form a flow of the process solution near the substrate. --

UNITED STATES PATENT AND TRADEMARK OFFICE
CERTIFICATE OF CORRECTION

PATENT NO.    : 6,380,099 B2
DATED         : April 30, 2002
INVENTOR(S)   : Kiyofumi Sakaguchi et al.

It is certified that error appears in the above-identified patent and that said Letters Patent is hereby corrected as shown below:

<u>Column 24,</u>
Line 63-65, claim 33 should read
-- The method according to claim 12, wherein, in processing the substrate while supplying the ultrasonic wave to the substrate, a relative positional relationship between the substrate and an ultrasonic source is changed. --

Signed and Sealed this

Fourth Day of February, 2003

JAMES E. ROGAN
*Director of the United States Patent and Trademark Office*